United States Patent
Tsuchiya

(10) Patent No.: US 7,126,275 B2
(45) Date of Patent: Oct. 24, 2006

(54) SYSTEM AND METHODS FOR PROVIDING ORGANIC ELECTRO-LUMINESCENCE ELEMENTS

(75) Inventor: Yutaka Tsuchiya, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 93 days.

(21) Appl. No.: 10/372,926

(22) Filed: Feb. 26, 2003

(65) Prior Publication Data

US 2003/0214227 A1  Nov. 20, 2003

(30) Foreign Application Priority Data

Feb. 27, 2002 (JP) .............................. 2002-052071

(51) Int. Cl.
*H05B 33/00* (2006.01)
*G02F 1/13* (2006.01)

(52) U.S. Cl. .................... 313/516; 313/504; 313/512

(58) Field of Classification Search ........ 313/503–509, 313/512, 112; 349/63, 69, 71; 345/36, 45, 345/76; 445/24; 428/690, 917
See application file for complete search history.

(56) References Cited

U.S. PATENT DOCUMENTS

| | | | |
|---|---|---|---|
| 4,634,639 A | * | 1/1987 | Kawai ........................ 428/690 |
| 5,652,067 A | * | 7/1997 | Ito et al. ...................... 428/690 |
| 5,796,509 A | | 8/1998 | Doany et al. |
| 5,958,610 A | * | 9/1999 | Yonekawa et al. ........... 428/690 |
| 6,075,317 A | * | 6/2000 | Keyser et al. .............. 313/505 |

* cited by examiner

*Primary Examiner*—Ashok Patel
(74) *Attorney, Agent, or Firm*—Oliff & Berridge, PLC

(57) ABSTRACT

The invention provides an organic electro-luminescence element having improved reliability and light emission characteristics and its manufacturing method. The organic electro-luminescence element can include a first substrate, an anode containing a transparent conductive material, a light emitting layer containing an organic electro-luminescence material, cathodes, each including a metal layer and formed in a portion of a forming region for the light emitting layer, antireflection layers, and at least one of a protection layer and a sealing layer. The anode, light emitting layer, and cathodes are stacked on the first substrate in order, the antireflection layers are stacked corresponding to the cathodes, and the at least one of the protection layer and sealing layer can be formed at least between the cathodes and antireflection layers.

19 Claims, 12 Drawing Sheets

(d)

(e)

(f)

(a)

(b)

(d)

(e)

(f)

SYSTEM AND METHODS FOR PROVIDING ORGANIC ELECTRO-LUMINESCENCE ELEMENTS

BACKGROUND OF THE INVENTION

1. Field of Invention

The present invention relates to an organic electro-luminescence (EL) element, a method for manufacturing the same, and a display device. More specifically, the invention relates to the configuration of an organic EL element with excellent reliability.

2. Description of Related Art

In recent years, a display device with an organic EL element has been in the spotlight as a selfluminous type display device. It has been thought that the organic EL element itself may be used as, not only a display for representation, but also a frontlight (illumination device) for a nonluminous type display device, such as a reflected type liquid crystal panel. In the case of using an organic EL element as a display for representation, it may be so arranged that a metal electrode used as a cathode is formed on the substrate and users visually recognize through a transparent electrode used as an anode with a light emitting layer interposed between the electrodes. In this case, the cathode can be formed over the entire surface of the substrate without the need for patterning. In contrast, for example, in the case of using an organic EL element as a frontlight for a display device, cathodes each composed of a metal electrode cannot be formed over the entire surface of the substrate, so that cathode patterning is required in order to visually recognize the display.

FIG. 17 is a view showing an example of the basic configuration of a conventional organic EL element used as a frontlight for a display device. The organic EL element 103 is arranged to have a transparent electrode (anode) 117, a hole transport layer 122, a light emitting layer 118 of an organic EL material, and cathodes 121, which are stacked on a glass substrate 116 in order, and further a sealing layer 126 formed so as to cover the resultant substrate and a cover glass 127 formed on the sealing layer. The organic EL element emits light through recombination of holes and electrons in the light emitting layer 118, when holes and electrons are injected into the light emitting layer 118 from positive and negative electrodes.

In the organic EL element 103, in order to enhance an electron injection efficiency of electrons injected from the cathodes 121 into the light emitting layer 118, keep the stability of the cathodes, and ensure the reflectivity, as the cathodes 121 are used multilayered electrodes each composed of an alkaline-earth metal layer 119 of a material with a low work function such as calcium (Ca) and magnesium (Mg), and a metal layer 120 of a material with a higher work function and a high visible light reflectivity such as aluminum (Al) and silver (Ag).

SUMMARY OF THE INVENTION

As described above, such cathode 121, however, includes a layer of a metal with a metallic luster such as Al. As a result, when observing from the visually-recognized side (through the cover glass 127), light incident from the outside is reflected off the cathodes 121. This makes the display indistinct and reduces the contrast. Therefore, to overcome the above problems, a low-reflective layer 125 of a material, such as chromium oxide, is formed on each cathode 121.

In forming the above low-reflective layer, a layer of a material, such as chromium oxide, is to be formed on the cathode 121 by sputtering before patterning it by photolithography. However, a layer 120 of a metal, such as Al, is exposed to a liquid developer in a process of photolithography when patterning the low-reflective layer, whereby the metal layer 120 can be corroded and further the alkaline-earth metal layer 125 located under the metal layer can be corroded due to the presence of a pin hole in the metal layer 120, leading to the decrease in reliability.

Further, in a process of photolithography when forming the low-reflective layer, the light emitting layer 118 can be subjected to thermal damage due to the light absorbed by the low-reflective layer material such as chromium oxide. This results in the decrease in reliability and the degradation in light emission characteristics.

The invention was made to solve the above problems. It is an object of the invention to provide an organic EL element having the structure which makes it possible to surely prevent the degradation of cathodes and a light emitting layer and to improve the reliability and light emission characteristics, and a method for manufacturing the same.

To achieve the above object, the present invention provides an organic EL element of the invention that can include a first substrate, an anode containing a transparent conductive material a light emitting layer containing an organic electro-luminescence material, cathodes, each including a metal layer and formed in a portion of a forming region for the light emitting layer, antireflection layers, and at least one of a protection layer and a sealing layer. The anode, light emitting layer, and cathodes are stacked on the first substrate in an order where the antireflection layers are stacked corresponding to the cathodes, and the at least one of the protection layer and sealing layer is formed at least between the cathodes and antireflection layers.

In the organic EL element of the invention, the at least one of the protection layer and sealing layer, and the antireflection layers may be covered by a second substrate.

In the organic EL element of the invention, the sealing layer may be formed on the protection layer.

In the organic EL element of the invention, the protection layer may be formed at least between the cathodes and antireflection layers, and the sealing layer may be formed at least adjacent to the antireflection layers.

In the organic EL element of the invention, the antireflection layer can be appropriately selected from at least chromium (Cr) containing layers, black pigment containing layers, and the like. An example of the Cr containing layers is a Cr/Cr-oxide stacking layer. An example of the black pigment containing layers is a layer of a heat-hardening epoxy resin enriched with a black pigment such as carbon black.

It is preferred to use a transparent material with a high optical transmissivity as a material for the protection layer. Such material is appropriately selected from, for example, $SiO_2$, $Si_3N_4$, $CaF_2$, $MgF_2$, LiF, heat-hardening epoxy resin, and the like, further, a material for the sealing layer formed between the cathodes and antireflection layers can be appropriately selected from a heat-hardening resin, such as epoxy resin, and a photo-hardening resin such as acrylic resin.

An organic EL element as a subject matter of the invention can be arranged such that cathodes are not formed on a first substrate all over but partially formed through patterning above the first substrate with a light emitting layer interposed between the cathodes and first substrate, and antireflection layers are formed corresponding to the cathodes through patterning.

In the case of manufacturing an organic EL element of such configuration by a conventional method, an anode, a light emitting layer, and cathodes are formed to be stacked on a first substrate in this order and then antireflection layers are formed through patterning. However, the cathodes are exposed to chemicals including a liquid developer, and the like in the step of photolithography when patterning the antireflection layer. This causes the degradation and corrosion of the cathodes, thereby decreasing the reliability.

Also, in the case of manufacturing an organic EL element of the above configuration by a conventional method, a light emitting layer may be damaged by heat resulting from the light absorption of an anti-reflecting material layer in the step of photolithography when patterning the antireflection layer. This also causes the deterioration in the reliability and light emission characteristics.

In contrast, an organic EL element according to the invention is so arranged that at least one of a protection layer and a sealing layer is formed at least between the cathodes and antireflection layers. Therefore, for example, using a first method for manufacturing an organic EL element of the invention, described later, cathodes are not exposed to chemicals including a liquid developer, and the like in the step of photolithography when patterning antireflection layers and thus the degradation of the cathodes can be prevented.

Also, in the case where antireflection layers are formed from layers containing a black pigment, such as a black pigment containing resin layer, the cathodes and light emitting layer are not affected in forming antireflection layers. Therefore the degradation of cathodes and a light emitting layer can be prevented.

In addition, even when the anti-reflecting material layer absorbs ultraviolet light in the foregoing photolithography step, heat produced by the light absorption does not affect the light emitting layer, so that the degradation of the light emitting layer can be prevented. Therefore, according to the invention, it is possible to prevent the degradation of cathodes and a light emitting layer certainly and improve the reliability and light emission characteristics of an organic EL element.

Further, for example, when a second method for manufacturing an organic EL element of the invention, described later, is used to form an anode, a light emitting layer, and cathodes to be stacked on a first substrate in this order and to form a protection layer on the cathodes and antireflection layers upwardly from the protection layer, the organic EL element takes on a structure such that the protection layer cover the cathodes. As a result, the cathodes are not exposed to chemicals including a liquid developer, and the like in the step of photolithography when patterning antireflection layers and therefore the degradation of the cathodes can be prevented.

Also, in this structure, the light emitting layer is also covered by the protection layer through cathodes. This is because the protection layer is formed on the cathodes. Accordingly, in the case where the antireflection layers are formed from layers containing a black pigment such as a black pigment containing resin layer, the cathodes and light emitting layer are not affected in forming the antireflection layers and thus the degradation of the cathodes and light emitting layer is prevented.

Further, the above structure, in which a light emitting layer is also covered by a protection layer through cathodes, allows the dissipation of heat resulting from light absorption when the anti-reflecting material layers absorb ultraviolet light in the above photolithography step. Therefore, the light emitting layer is not affected and it becomes possible to prevent the degradation of the light emitting layer.

In the organic EL element of the invention, a gap material may be mixed into the sealing layer, the gap material filled sealing layer may be formed on the protection layer substantially in an annular form, and a space located inwardly from the gap material filled sealing layer may be charged with a matching oil.

According this configuration, for example, in the case of manufacturing an organic EL element using the first method for manufacturing an organic EL element of the invention, described below, forming the gap material filled sealing layer on the first or second substrate in a substantially annular form facilitates the movement and alignment of the first and second substrates when aligning the cathode-located side of the first substrate and the antireflection-layer-located side of the second substrate in comparison to the case of forming the sealing layer substantially all over the surface.

As for the matching oil, an oil having a refractive index approximately equal to that of the second substrate can be used. For example, in the case of using a glass substrate having a refractive index of about 1.5–1.6 as the second substrate, a silicon-based matching oil having a refractive index of about 1.503 or the like is used as the matching oil. Charging such matching oil into the foregoing space allows the loss of light incident on the organic EL element from the outside to be suppressed.

The antireflection layers may be formed to be larger than the cathodes in width.

In the organic EL element of the invention, the cathodes are each composed of a multilayered electrode including an alkaline-earth metal layer and a metal layer.

The alkaline-earth metals can include four elements, magnesium (Mg), calcium (Ca), strontium (Sr), and barium (Ba). For the metal layer, a metal having a high visible light reflectivity such as aluminum (Al) and silver (Ag) is often used.

The cathodes each composed of such multilayered electrode make it possible to enhance an electron injection efficiency of electrons injected from the cathodes into the light emitting layer, keep the stability of the cathode, and ensure the reflectivity.

On the side surface of the alkaline-earth metal layer may be formed an alkaline-earth metal fluoride layer. The fluorides of the above-described alkaline-earth metals are chemically stable and have low reactivities to oxygen and moisture. Therefore, it is possible to prevent a alkaline-earth metal layer located inside a layer of such alkaline-earth metal fluoride from reacting with oxygen and moisture in the air, suppress the metamorphosis of the alkaline-earth metal layer, and improve the reliability of an organic EL element.

The first method for manufacturing an organic EL element of the invention is a method for manufacturing an organic EL element having a first substrate, an anode containing a transparent conductive material layer, a light emitting layer containing an organic electro-luminescence material, cathodes, each including a metal layer and formed in a portion of a forming region for the light emitting layer, and antireflection layers. The anode, light emitting layer, and cathodes are stacked on the first substrate in this order, the antireflection layers are stacked corresponding to the cathodes. The method can include the steps of forming at least the anode, light emitting layer, and cathodes to be stacked on the first substrate in this order, forming an anti-reflecting material layer on a second substrate, patterning the anti-reflecting material layer to form the antireflection layers, and aligning a cathode-located side of the first substrate and an antireflection-layer-located side of the second substrate and bonding the first and second substrates through a sealing layer.

In the first method for manufacturing an organic EL element of the invention, the step of forming the anode, light emitting layer, and cathodes can include forming a protection layer adjacent to the cathodes.

In the first method for manufacturing an organic EL element of the invention, the step of forming the anode, light emitting layer, and cathodes includes forming a protection layer at least upward from the cathodes.

In the first method for manufacturing an organic EL element of the invention, the sealing layer may be formed at least adjacent to the antireflection layers on the second substrate.

In the first method for manufacturing an organic EL element of the invention, the sealing layer may be formed to cover the antireflection layers.

The configuration of the organic EL element of the invention can be easily implemented using the first manufacturing method of the invention. More specifically, by using a substrate (second substrate) independent of a first substrate; forming antireflection layers on the second substrate through patterning, and putting together, aligning, and bonding the second substrate with the antireflection layers formed thereon and the first substrate with an anode, a light emitting layer, and cathodes, and a protection layer, if necessary, formed in areas laterally surrounding and upward from the cathodes, it is possible to avoid exposing the cathodes to chemicals including a liquid developer, etc. and therefore to prevent the degradation of the cathodes in the step of photolithography when patterning an antireflection layer.

In the case where the antireflection layers are formed from layers containing a black pigment such as a black pigment containing resin layer, the layer containing a black pigment is to be applied through spin coating. Nevertheless, the cathodes and light emitting layer are not affected and therefore the degradation of the cathodes and light emitting layer can be prevented when forming the layer containing a black pigment. This is because the layer containing a black pigment is formed on one side of the second substrate.

Further, even if the anti-reflecting material layer absorbs ultraviolet light in the above-described photolithography step, the light emitting layer is not affected by heat resulting from the light absorption. Consequently, the degradation of the cathodes and the light emitting layer can be prevented. Therefore, according to the invention, it is possible to prevent the degradation of a light emitting layer certainly and manufacture an organic EL element with improved reliability and light emission characteristics.

In the first method for manufacturing an organic EL element of the invention, the step of aligning a cathode-located side of the first substrate and an antireflection-layer-located side of the second substrate and bonding the first and second substrates through a sealing layer can include: bonding the first and second substrates through a gap material filled sealing layer formed on the first or second substrate substantially in an annular form; curing the gap material filled sealing layer. Thereafter, the method can include filling a space enclosed by the gap material filled sealing layer with a matching oil, and sealing in the matching oil.

According to the above configuration, forming the gap material filled sealing layer in a substantially annular form facilitates the movement and alignment of the cathode side first substrate and antireflection-layer side second substrate when aligning the cathode-located side of the first substrate and antireflection-layer-located side of the second substrate in comparison to the case of forming the sealing layer substantially all over the surface.

The second method for manufacturing an organic EL element of the invention is a method for manufacturing an organic EL element having a first substrate, an anode containing a transparent conductive material layer, a light emitting layer containing an organic electro-luminescence material, cathodes, each including a metal layer and formed in a portion of a forming region for the light emitting layer, and antireflection layers. The anode, light emitting layer, and cathodes are stacked on the first substrate in this order, the antireflection layers are stacked corresponding to the cathodes. The method can include the steps of forming at least the anode, light emitting layer, and cathodes to be stacked on the first substrate in this order, thereafter forming a protection layer at least upward from the cathodes forming an anti-reflecting material layer upward from the protection layer, and patterning the anti-reflecting material layer to form the antireflection layers, and forming a sealing layer at least adjacent to the antireflection layers.

The second method for manufacturing an organic EL element of the invention may further include the step of stacking a second substrate upward from the antireflection layers and sealing layer.

In the second method for manufacturing an organic EL element of the invention, the step of forming a protection layer at least upward from the cathodes may include forming the protection layer so as to cover the cathodes.

The configuration of the organic EL element of the invention can be easily implemented using the second manufacturing method of the invention. More specifically, cathodes are covered by a protection layer because of forming an anode, a light emitting layer, and the cathodes so as to be stacked on a first substrate in this order, forming the protection layer on the cathodes, forming antireflection layers on the protection layer. Therefore, the cathodes are not exposed to chemicals including a liquid developer, and the like in the step of photolithography when patterning antireflection layers and the degradation of the cathodes can be prevented.

In the case where the antireflection layers is formed from layers containing a black pigment such as a black pigment containing resin layer, the layer containing a black pigment is to be applied through spin coating. Nevertheless, the cathodes and light emitting layer are not affected and therefore the degradation of the cathodes and light emitting layer can be prevented when forming the layer containing a black pigment. This is because the protection layer covers not only the cathodes but also the light emitting layer through the cathodes by forming the protection layer on the cathodes.

In the case where the light emitting layer is also covered by the protection layer through the cathodes as described above, even if the anti-reflecting material layer absorbs ultraviolet light in the photolithography step, heat resulting from the light absorption is dissipated and light emitting layer is not affected. As a result, the degradation of the light emitting layer can be prevented.

In the first or second method for manufacturing an organic EL element of the invention, the anti-reflecting material layer may be formed from a layer containing Cr or a black pigment. An example of the layer containing Cr is a Cr/Cr-oxide stacking layer. Each layer thereof can be formed by film-growing methods including sputtering method, and the like. An example of the layer containing a black pigment is a black pigment containing resin. This black pigment-containing layer can be formed by coating methods including spin coating, etc.

In the case of making the protection layer out of $SiO_2$, a sputtering method can be used. In the case of $Si_3N_4$, the layer can be made by thermal CVD. In the case of CaF, $MgF_2$, LiF, etc., the layer can be made by vapor deposition. In the case of a heat-hardening epoxy resin, the layer can be made by coating methods including spin coating, etc.

In the first or second method for manufacturing an organic EL element of the invention, the antireflection layers may become larger than the cathodes in width when patterning the anti-reflecting material layer.

According to such configuration, in the case of manufacturing an organic EL element using the first method for manufacturing an organic EL element of the invention, the cathode side first substrate and the antireflection-layer side second substrate can be aligned easily. This is because the cathodes and the respective antireflection layers can be placed opposite each other even if there is some deviation in location between the first substrate and the second substrate when aligning the cathode-located side of the first substrate and the antireflection-layer-located side of the second substrate. In the case of manufacturing an organic EL element using the second method for manufacturing an organic EL element of the invention, the cathodes and antireflection layers can be placed opposite each other, even if there is some deviation in the location where antireflection layers are formed or some patterning inaccuracy in forming antireflection layers just above the cathodes through the protection layer.

A display device of the invention can include an illuminating unit having an organic electro-luminescence element, which takes on any one of the above-described configuration, and a display unit wherein light emitted from the illuminating unit is used for reflection display. According to such configuration, it is possible to provide a display device having an illuminating unit such as a frontlight with high reliability and improved light emission characteristics.

In the case where a reflection-type liquid crystal display device is used as the display unit, it is desirable that cathodes of the organic EL element constituting the illuminating unit are placed corresponding to non-opening regions of the reflection-type liquid crystal display device. According to such configuration, even when the display device has an illuminating unit with an organic EL element, it is possible to provide well-lit display without lowering an open area ratio of the reflection-type liquid crystal display device.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

In reference to FIGS. 1 to 7, a first embodiment of the invention is described below. In this embodiment, the liquid crystal display device is described as an example of a display device according to the invention. The display device can include an organic EL element of the invention as a frontlight (illuminating unit). The liquid crystal display device cited herein as an example, is of active matrix system reflection type, in which thin film transistors (hereinafter referred to as TFTs for short) are used as switching elements.

Figure 1:
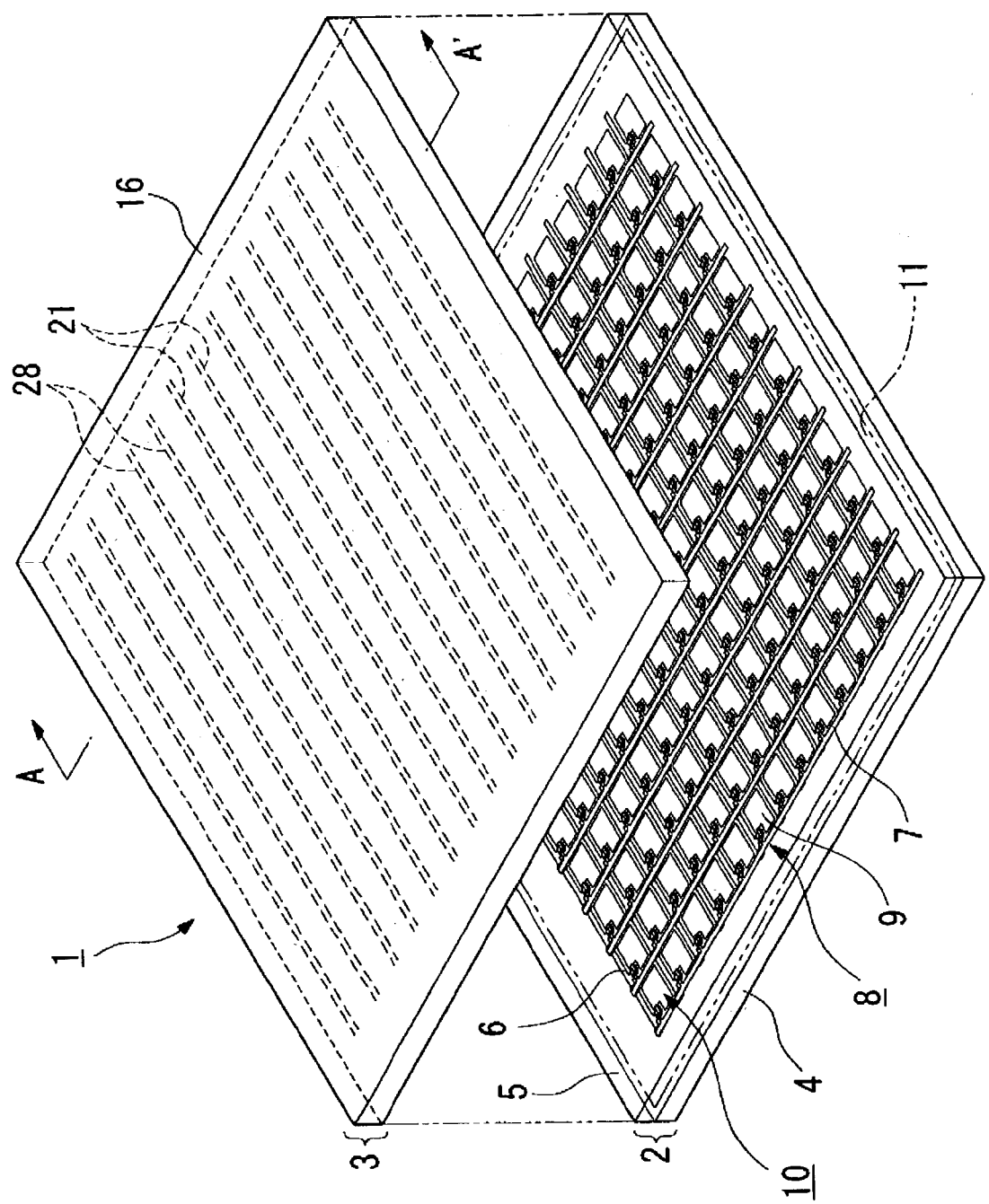
FIG. 1 is a perspective view generally showing a schematic configuration of a liquid crystal display device in a first embodiment of the invention.
Figure 2:
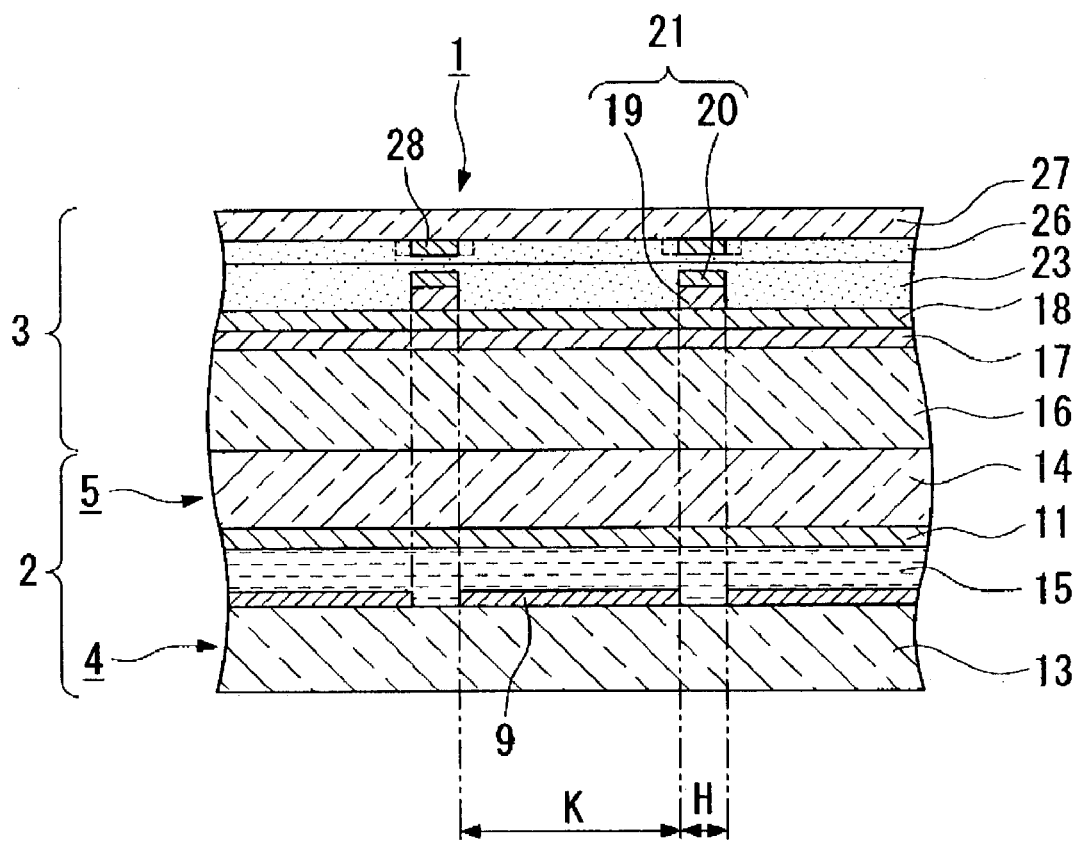
FIG. 2 is a cross section taken along the line A–A' in FIG. 1.
Figure 3:
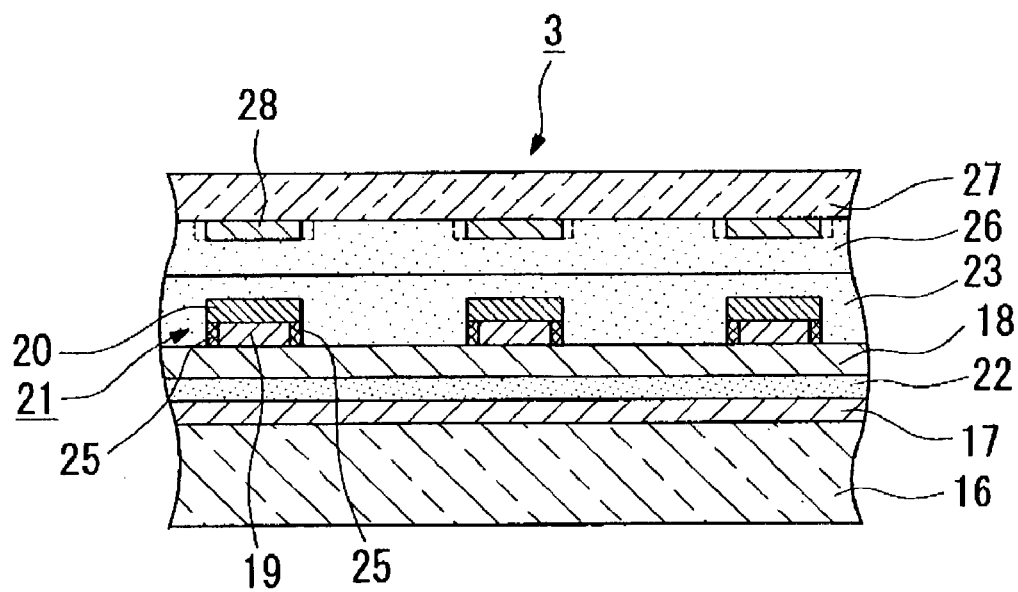
FIG. 3 is a cross section showing a frontlight of a liquid crystal display device in the first embodiment.

FIG. 1 is a perspective view generally showing a schematic configuration of a liquid crystal display device of the embodiment. FIG. 2 is a cross section taken along the line A–A' in FIG. 1. FIG. 3 is a cross section showing only a portion of a frontlight of the liquid crystal display device. FIGS. 4 to 7 are partial cross sections for explanation of process steps of a method for manufacturing the frontlight. In order to make individual layers and constituent elements recognizable in the drawings, the layers and elements are drawn respectively on different reduced scales in film thickness or size.

A liquid crystal display device 1 of the embodiment is primarily constituted by a liquid crystal cell 2 (display unit), and a frontlight 3 (illuminating unit) placed on the front side of the liquid crystal cell, as shown in FIG. 1. The liquid crystal cell 2 has a device-mounted substrate 4, on which TFTs are formed, an opposed substrate 5 placed opposed to the device-mounted substrate, and a liquid crystal layer (not shown) sealed between the substrates 4 and 5. On the inner surface of the device-mounted substrate 4, large numbers of source lines 6 and gate lines 7 are provided so as to intersect each other in a grid pattern. In the vicinity of each intersecting point of the source and gate lines 6 and 7 is formed a TFT 8. Pixel electrodes 9 are each connected through the respective TFT 8. In other words, one TFT 8 and one pixel electrode 9 are provided for each of pixels 10 arrayed in the form of a matrix. On the other hand, in the entire inner surface of the opposed substrate 5, a common electrode 11 is formed over the entire display area where a large number of pixels 10 are arrayed in a matrix form.

FIG. 2 shows a cross sectional structure of the liquid crystal cell 2. In the drawing, a glass substrate 13 used as a device-mounted substrate 4 is placed in the lower portion thereof. Pixel electrodes 9 are formed on the inner surface of a glass substrate 13 corresponding to respective pixels 10. On the other hand, a glass substrate 14 used as the opposed substrate 5 is placed in the upper portion thereof; and a common electrode 11 is formed on the inner surface of the glass substrate 14. The liquid crystal layer 15 made of a twisted nematic (TN) liquid crystal is held between the device-mounted substrate 4 and the opposed substrate 5. Incidentally, the illustrations of various kinds of lines on the inner surface of each substrate, TFTs 8, an alignment layer, etc. are omitted in FIG. 2.

The frontlight 3 is placed on the upper surface of the liquid crystal cell 2. The frontlight 3 is primarily constituted by a transparent electrode 17 (anode) formed all over a glass substrate 16 (first substrate), a light emitting layer 18 over the transparent electrode, Ca/Al multilayered electrodes 21 (cathodes) each composed of a Ca-layer 19 (an alkaline-earth metal layer) and an Al-layer 20 (a metal layer with a high visible light reflectivity, i.e. conductor layer) on portions of the light emitting layer 18, a protection layer 23 formed on the entire surface of the resulting substrate so as to cover it, a sealing layer 26 formed all over the surface of the protection layer 23, antireflection layers 28 formed on portions of the sealing layer 26 corresponding to the respective Ca/Al multilayered electrodes 21, and a cover glass 27 (second substrate) covering the sealing layer 26 and antireflection layers 28.

For the sake of simplicity, in FIG. 2, the edge of each pixel electrode 9 of the liquid crystal cell 2 is an opening region K that effectively contributes to display, and a region between adjacent pixel electrodes 9 is a non-opening region H where an unshown shielding film is placed. In the liquid crystal display device 1 of the embodiment, the Ca/Al multilayered electrodes 21 of the organic EL element are placed corresponding to the non-opening regions H of the liquid crystal cell 2, respectively. As described above, the antireflection layers 28 are formed corresponding to the Ca/Al multilayered electrodes 21, so that the antireflection layers 28 are also placed corresponding to the non-opening regions H of the liquid crystal cell 2.

The configuration of the frontlight 3 is shown in FIG. 3, more particularly. A transparent electrode 17 composed of a film of transparent conductor, such as Indium Tin Oxide (ITO), is formed all over on a glass substrate 16, and then a hole transport layer 22 and a light emitting layer 18 are sequentially stacked on the transparent electrode 17 in this order. In the embodiment, a material used for the hole transport layer 22 is for example available from Bayer AG under the trade name of "Bytron P." As a material for the light emitting layer 18, a white light emitting polymeric material may be used, for example. The Ca/Al multilayered electrodes 21 each composed of (1) a Ca-layer 19 (alkaline-earth metal layer) and (2) an Al-layer 20 (conductor layer) are formed on portions of the light emitting layer 18. On the side surface of the Ca-layer 19, a $CaF_2$ (alkaline-earth metal fluoride) layer 25 is formed.

In areas laterally surrounding the Ca/Al multilayered electrodes 21 (i.e. upward from the light emitting layer 18) and upward from the Ca/Al multilayered electrodes 21 (on the side opposite from the light emitting layer 18) is formed a protection layer 23 made of a material such as $SiO_2$, $Si_3N_4$, $CaF_2$, $MgF_2$, LiF, and heat-hardening epoxy resin.

All over the upper surface of the protection layer 23, i.e., a surface of the layer 23 located on the side opposite from the multilayered electrode 21, there is formed the sealing layer 26 of a heat-hardening resin such as epoxy resin, or a photo-hardening resin such as acrylic resin. In addition, the antireflection layers 28 are formed on portions of the sealing layer 26 corresponding to the Ca/Al multilayered electrodes 21. The antireflection layers 28 are intended to prevent the reflection from the multilayered electrode 21, more particularly the Al-layer 20. The antireflection layers 28 can prevent the light incident from the outside from being reflected by the Al-layer 20 to facilitate the visual recognition of the display and improve the contrast when observing the liquid crystal display device 1 from the visually-recognized side (the side where the cover glass 27 is located). The antireflection layers 28 are layers containing Cr or a black pigment, or the like. Such Cr-containing layer may be for example a Cr/Cr-oxide stacking layer. Further, an example of the layer containing a black pigment is a heat-hardening epoxy resin with a black pigment such as carbon black. The antireflection layers 28 may be formed to have a width larger than that of the multilayered electrode 21, as indicated with dotted lines in FIGS. 2 and 3.

The cover glass 27 (second substrate) covers the upper sides of the sealing layer 26 and antireflection layers 28, i.e., sides of the layers 26 and 28 on the side opposite from the multilayered electrodes 21.

The thicknesses in association with the above multilayered structure are exemplary cited in the order, in which the layers are located away from the bottom of the drawing sheet, as follows: about 0.5 mm for the glass substrate 15; approximately 100–200 nm, e.g. 150 nm, for the transparent electrode 17; about 50 nm for the hole transport layer 22; about 50 nm for the light emitting layer 18; about 20 nm for the Ca-layer 19; about 200 nm for the Al-layer 20; about 50 nm for the protection layer 23 on the light emitting layer 18 (a portion of the protection layer 23 where the multilayered electrode 21 is not formed); about 5 μm for the portion of the sealing layer 26 where the antireflection layers 28 are not formed; about 100nm for the antireflection layers 28; and about 0.1 mm for the cover glass 27. In addition, the width of the Ca/Al multilayered electrode 21 is about 10 μm. The antireflection layers 28 are comparable to the Ca/Al multilayered electrodes 21 in width. The width of the antireflection layers 28 may be larger than that of the multilayered electrodes 21 approximately by 1–2 μm, as indicated with the dotted lines in FIGS. 2 and 3.

Figure 4:
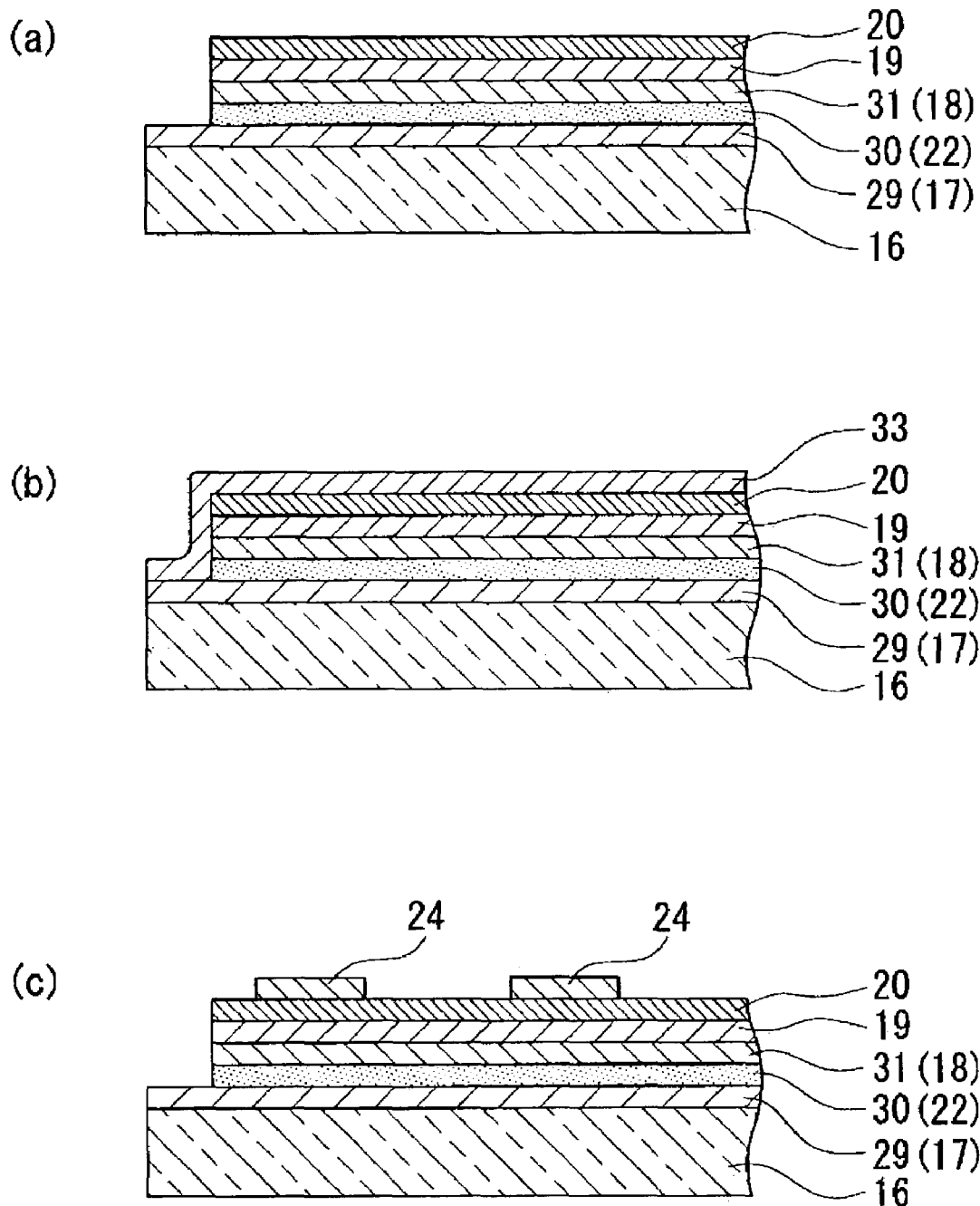
FIGS. 4A–4C are cross sections for explanation of process steps of a method for manufacturing the frontlight.
Figure 5:
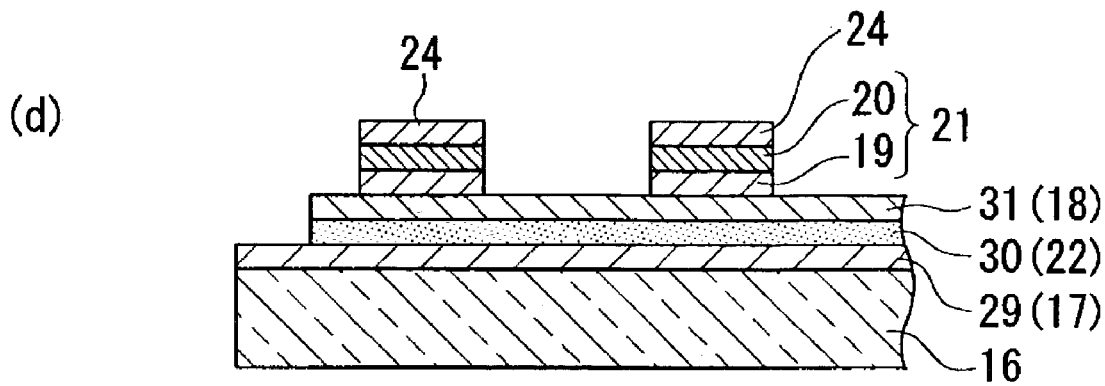
FIGS. 5D–5F are cross sections for explanation of process steps following the steps illustrated in FIGS. 4A–4C.
Figure 5:
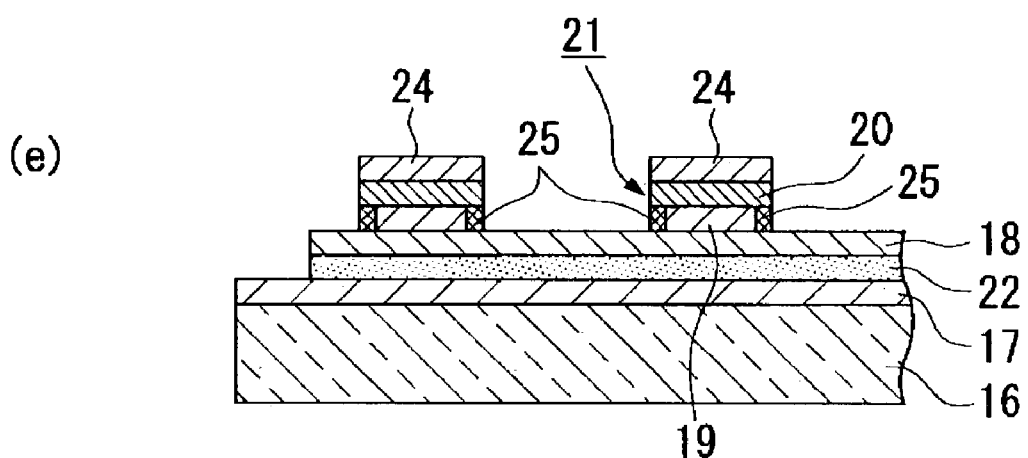
Figure 5:
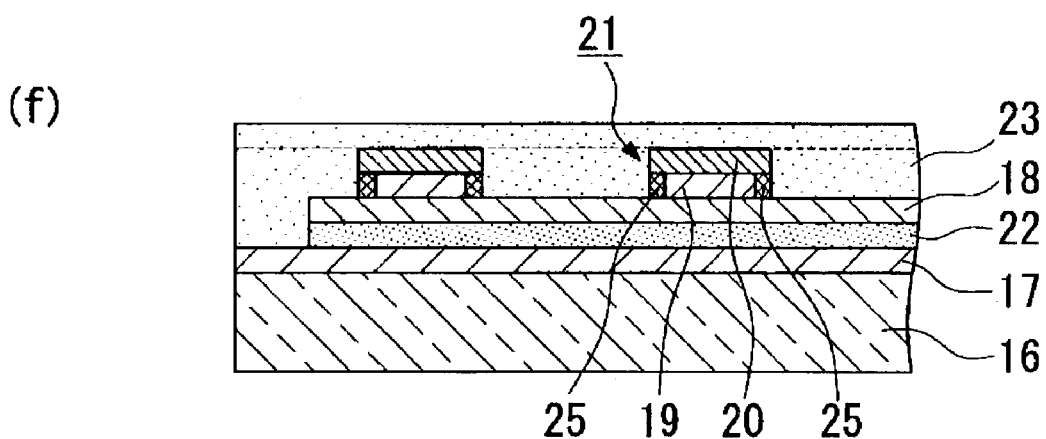
Figure 6:
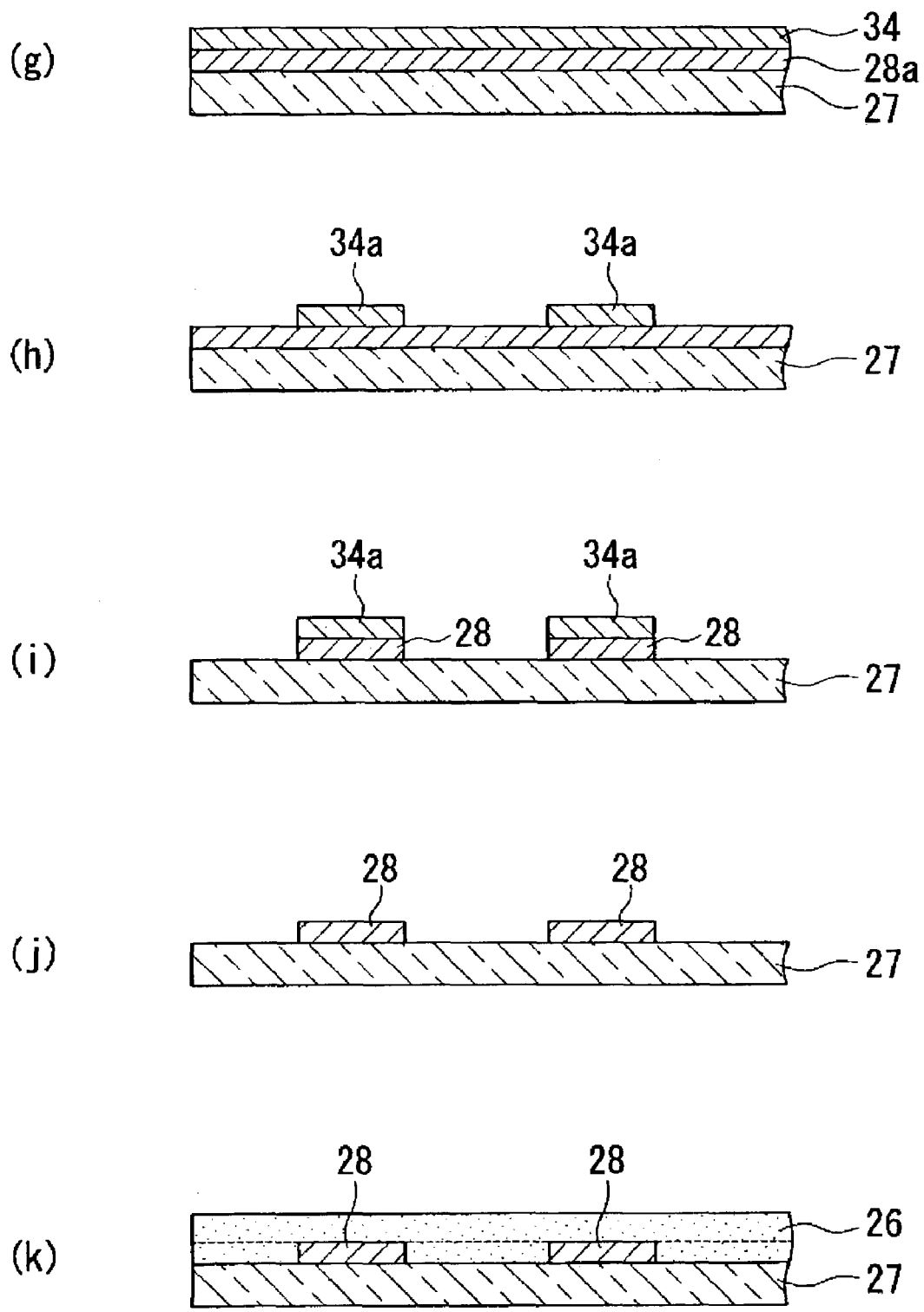
FIGS. 6G–6K are cross sections for explanation of process steps following the steps illustrated in FIGS. 5D–5F.

In reference to FIGS. 4 and 5, a method for manufacturing a frontlight composed of an organic EL element having the above configuration is described below. Incidentally, FIGS. 4 to 7 show an end portion of the substrate.

First, as shown in FIG. 4A, on a glass substrate 16 (first substrate) are formed a transparent conducting film 29 of ITO (transparent conductive material), etc. used as the transparent electrode 17 (transparent conductor layer), a Bayer's Bytron P film 30 used as the hole transport layer 22, a white light emitting polymeric material film 31 used as the light emitting layer 18, a Ca-layer 19 used as the alkaline-earth metal layer, and an Al-layer 20 used as the conductor layer in this order. The following methods can be adopted as a method of forming the light emitting layer 18: vapor deposition, etc. when using a low-molecular weight organic electro-luminescence material; droplet projection methods including ink-jet, coating methods including spin coating, or the like when using a high-molecular weight organic electro-luminescence material.

As shown in FIG. 4B, a photoresist film 33 is further formed on the Al-layer 20, sequentially. Incidentally, as for an end portion of the substrate 16, the films are formed after the formation of given masks, whereby forming the light emitting layer 18, hole transport layer 22, Ca-layer 19, Al-layer 20 so as to have side surfaces located a bit inward compared to the side surface of the glass substrate 16. After that, the photoresist film 33 is formed, with its photoresist formation area extended as far as the side surface of the glass substrate 16, so as to cover all the side surfaces of the light emitting layer 18, hole transport layer 22, Ca-layer 19, and Al-layer 20.

Then, as shown in FIG. 4C, a photoresist pattern 24 is formed by performing the exposure and development of the photoresist film 33 using the photolithography technique.

Subsequently, as shown in FIG. 5D, the Al-layer 20 and Ca-layer 19 are etched one after another by dry etching, in which the photoresist pattern 24 is used as a mask, until the surface of the light emitting layer 18 is exposed. As for the etching gas, a chlorine-based gas, for example, containing $BCl_3$ may be used for the Al-layer 20. For the Ca-layer 19, the sputter etching with Ar gas, for example, may be applied. In this step, the Ca/Al multilayered electrode 21 is patterned.

Incidentally, while it has been described that the Ca-layer 19 and Al-layer 20 are patterned by the photolithography technique in the steps shown in FIGS. 4A–5D, the Al-layer 20 and Ca-layer 19 may be formed one after another by placing a mask with openings according to a Ca/Al multilayered electrode pattern on the white light emitting polymeric material film 31 and performing the vapor deposition after forming the polymeric material film 31 in the step shown in FIG. 4A.

After that, as shown in FIG. 5E, the exposed portion of the Ca-layer 19, i.e. the side surface thereof, is fluorinated into $CaF_2$ layers 25 by performing a plasma fluorinating treatment. In this step, the side surface of the Al-layer 20 is also slightly fluorinated, actually. Incidentally, if the plasma fluorinating treatment is performed immediately after the side surface of the Ca-layer 19 is exposed through the dry etching step, the metamorphosis of the Ca-layer 19 can be suppressed to a certain degree. However, it is preferred to perform the operations in an inert gas atmosphere without exposing the substrate to the air, if possible, during a time interval between the exposure of the side surface of the Ca-layer 19 and the end of the plasma fluorinating treatment. Then, it is possible to certainly prevent the metamorphosis of the Ca-layer 19. More specifically, it is appropriate to adopt, for example, a procedure of etching and plasma-fluorinating the individual layers only by changing the gases with the first substrate left in a chamber of the dry etching system, or a procedure of transferring the substrate in an inert gas atmosphere such as nitrogen gas when it is difficult to conduct the former procedure.

Thereafter, the photoresist pattern 24 is removed with a resist stripper.

Next, as shown in FIG. 5F, the protection layer 23 is formed all over so as to cover the patterned Ca/Al multilayered electrodes 21 and the light emitting layer 18. This forms a protection layer 23 in areas laterally surrounding and upward from the Ca/Al multilayered electrodes 21.

In this step, a sputtering method is used in the case where the protection layer is made of $SiO_2$; thermal CVD is used in the case it is made of $Si_3N_4$; vapor deposition is used in the case it is made of $CaF_2$, $MgF_2$, LiF, or the like; and a coating method such as spin coating is used in the case it is made of heat-hardening epoxy resin.

In this embodiment, the word cathode side glass substrate (cathode-side first substrate or device-side glass substrate) refer to a substrate produced by the steps of forming a transparent electrode 17 on a glass substrate 16, a hole transport layer 22 on the transparent electrode, a light emitting layer 18 on the hole transport layer, Ca/Al multi-layered electrodes 21 on the light emitting layer, and a protection layer 23 all over, as described above.

In contrast, as shown in FIG. 6G, on the cover glass 27 (second substrate) is formed an anti-reflecting material layer 28a composed of a layer containing Cr or a black pigment, and then a photoresist film 34 is formed on the anti-reflecting material layer 28a. The methods of forming the anti-reflecting material layer 28a can include a film-growing method, such as sputtering in the case of forming an anti-reflecting material layer 28a composed of a Cr layer and chromium oxide, and a method for spin-coating a black pigment containing resin in the case of forming an anti-reflecting material layer 28a composed of a black pigment containing resin layer.

Then, as shown in FIG. 6H, the exposure and development of the photoresist film 34 are performed by the photolithography technique, thereby forming a photoresist pattern 34a.

Subsequently, as shown in FIG. 6I, the anti-reflecting material layer 28a is etched using the photoresist pattern 34a as a mask through wet etching until the surface of the cover glass 27 is exposed. Incidentally, when patterning the anti-reflecting material layer 28a, the antireflection layers 28 may be larger than the multilayered electrodes 21 in width.

Thereafter, antireflection layers 28 are attained by removing the photoresist pattern 34a with a resist stripper, as shown in FIG. 6J. Incidentally, the photoresist pattern 34a may be left without being removed from there.

In the next step, the sealing layer 26 can be formed so as to cover exposed surfaces of the antireflection layers 28 and cover glass 27 all over, thereby forming a sealing layer 26 in areas laterally surrounding and upward from the antireflection layers 28, as shown in FIG. 6K. The methods for forming the sealing layer 26 include a method for coating a fluid resin by spin coating, and the like in the case of forming a sealing layer made of a heat-hardening resin such as epoxy resin or a photo-hardening resin such as an acrylic resin.

In this embodiment, the word antireflection-layer side cover glass (antireflection-layer side second substrate) refers to a cover glass producing by forming antireflection layers 28 on a cover glass 27 and a sealing layer 26 thereon as described above.

Figure 7:
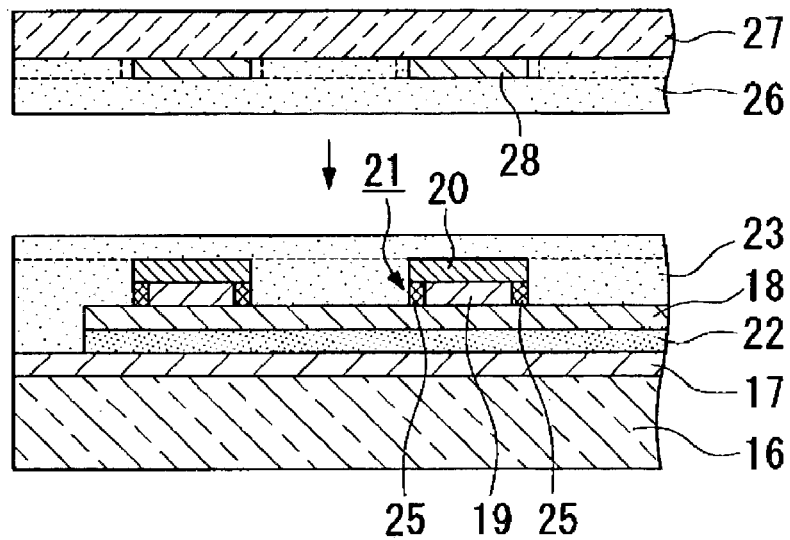
FIG. 7 is a cross section for explanation of the process steps following the steps illustrated in FIGS. 6G–6K.

Subsequently, as shown FIG. 7, the cathode side glass substrate 16 and antireflection-layer side cover glass 27 are put together, aligned with each other, and bonded, whereby a frontlight 3 having an organic EL element of the embodiment as shown in FIG. 3 can be completed.

The frontlight 3 having an organic EL element of the embodiment is so arranged that the protection layer 23 and sealing layer 26 are formed between the Ca/Al multilayered electrodes 21 and antireflection layers 28. Therefore, in manufacturing a frontlight of such structure, a substrate (cover glass 27) independent of the glass substrate 16 is used as described above to form antireflection layers 28 on the cover glass 27 through patterning, put together, align, and bond the antireflection-layer side cover glass 27 and the cathode side glass substrate 16. This procedure can avoid exposing the multilayered electrode 21, especially the Al-layer 20 to chemicals including a liquid developer, etc. and prevent the degradation of the multilayered electrode 21 in the step of photolithography when patterning the antireflection layers 28.

In the case where the antireflection layers 28 are formed from a black pigment containing resin layer, the black pigment containing resin layer is to be formed by applying a black pigment containing resin through spin coating. Nevertheless, the cathodes 21 and light emitting layer 18 are not affected, and therefore the degradation of the cathodes 18 and light emitting layer 18 can be prevented when forming the black pigment containing resin layer. This is because the black pigment containing resin layer is formed on the side of the cover glass 27.

In addition, because the anti-reflecting material layer 28a is formed on the side of the cover glass 27, even if the anti-reflecting material layer 28a absorbs ultraviolet light in the above-described photolithography step when patterning the antireflection layer, the light emitting layer 18 is not affected by heat resulting from the light absorption. Therefore, the degradation of the light emitting layer 18 can be prevented.

According to a frontlight 3 having an organic EL element of the embodiment and its manufacturing method, it is possible to prevent the degradation of the cathodes 21 and light emitting layer 18 certainly and improve the reliability and light emission characteristics of an organic EL element.

Further, in the case where the antireflection layers 18 are larger than the cathodes 21 in width, in manufacturing a frontlight of such structure, the cathode side glass substrate 16 and the antireflection-layer side cover glass 27 can be aligned easily. This is because the multilayered electrodes 21 and the respective antireflection layers 18 can be placed opposite each other even if there is some deviation in location between the cathode side glass substrate 16 and the antireflection-layer side cover glass 27 when performing the alignment of the cathode side glass substrate 16 and antireflection-layer side cover glass 27.

Also, in the frontlight 3 of the embodiment, an alkaline-earth metal fluoride layer 25 can be formed on the side surface of the alkaline-earth metal layer 19. As a result, the time period during which the side surface of the alkaline-earth metal layer 19 is exposed in the manufacturing step is shortened, thereby making possible to prevent the alkaline-earth metal layer 19 from reacting with oxygen or moisture in the atmosphere, suppress the metamorphosis of the alkaline-earth metal layer, and improve the reliability of an organic EL element.

According to the embodiment, it is possible to provide a liquid crystal display device having a frontlight 3 with high reliability and improved light emission characteristics. Additionally, even when a liquid crystal display device has a frontlight with an organic EL element, it is possible to provide well-lit display without lowering an open area ratio, since the Ca/Al multilayered electrodes 21 of the organic EL element are placed corresponding to non-opening regions of the liquid crystal cell 2.

Figure 8:
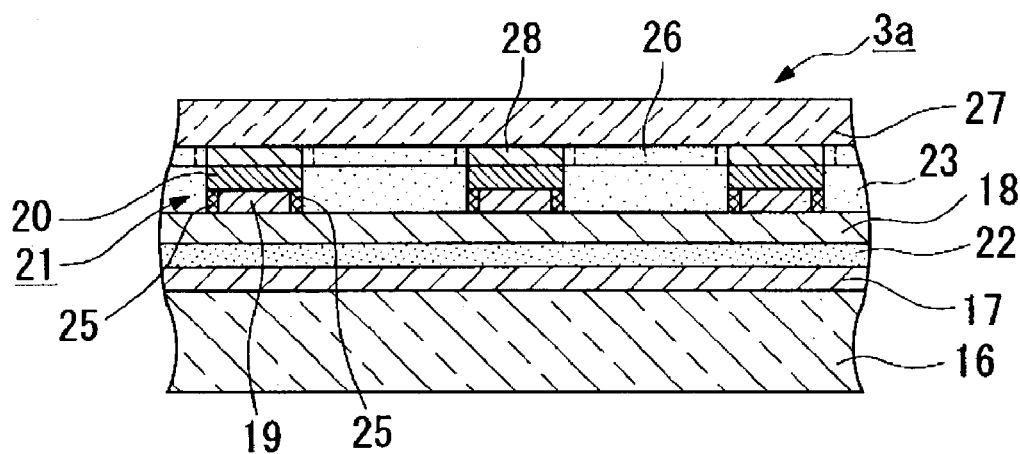
FIG. 8 is a cross section showing a frontlight according to another embodiment of the invention.

The protection layer 23 is formed in areas laterally surrounding and upward from the patterned Ca/Al multilayered electrodes 21 in the step shown in FIG. 5F. However, the protection layer 23 may be formed only in areas laterally surrounding the patterned Ca/Al multilayered electrodes 21 and areas upward from the Ca/Al multilayered electrodes 21 may be left exposed as illustrated by the dotted line in FIG. 5F. Further, the sealing layer 26 is formed in areas laterally surrounding and upward from the patterned antireflection layers 28 in the step shown in FIG. 6K. However, the sealing layer 26 may be formed in areas laterally surrounding the antireflection layers 28 (the sealing layer 26 may be formed adjacent to the antireflection layers 28) and the top surfaces of the antireflection layers 28 may be left exposed as illustrated by the dotted line in FIG. 6K. The cathode side glass substrate 16 with the top surfaces of the Ca/Al multilayered electrodes 21 exposed and the antireflection-layer side cover glass 27 with the top surfaces of the antireflection layers 28 exposed are thus aligned and bonded with each other, whereby a frontlight 3a of another embodiment of the invention, as shown in FIG. 8, is completed.

In the frontlight 3a, Ca/Al multilayered electrodes 21 and antireflection layers 28 are in contact with each other. However, also in manufacturing the frontlight 3a, a substrate (cover glass 27) independent of the glass substrate 16 is used to form the antireflection layers 28 on the cover glass 27 through patterning. As a result, it becomes possible to certainly prevent the degradation of the cathodes 21 and light emitting layer 18 and improve the reliability and light emission characteristics of an organic EL element.

In reference to FIGS. 9 and 10, a second embodiment of the invention is described below.

Figure 9:
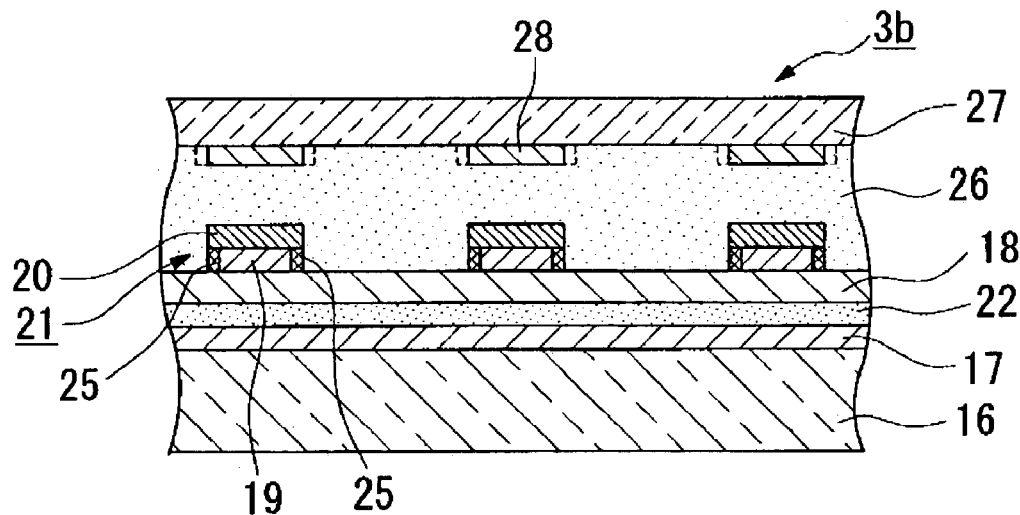
FIG. 9 is a cross section showing a frontlight according to a second embodiment of the invention.
Figure 10:
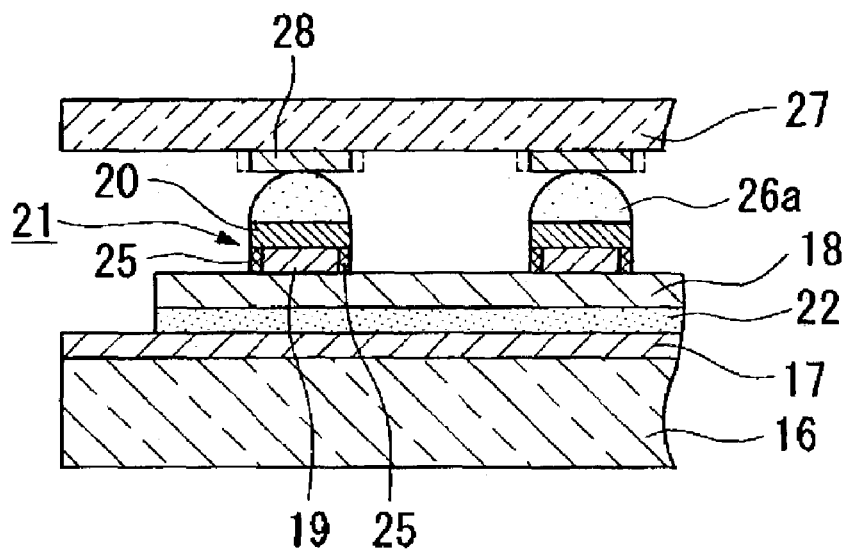
FIG. 10 is a cross section for explanation of process steps of a method for manufacturing the frontlight.

FIG. 9 is a cross section showing a frontlight of a liquid crystal display device of the embodiment. FIG. 10 is a cross section for explanation of process steps of a method for manufacturing the frontlight.

A liquid crystal cell of a liquid crystal display device of the embodiment has the same basic configuration as that of the first embodiment. A frontlight 3b of a liquid crystal display device of the embodiment is the same that of the first embodiment, except for a difference in the layer interposed between the cathode side glass substrate 16 and antireflection-layer side cover glass 27. Therefore, constituent elements commonly used in FIGS. 9, 10 and FIGS. 3–7 are identified by the same reference characters or numerals, and their detailed descriptions are omitted. Incidentally, the cathode side glass substrate 16 of the embodiment has no protection layer 23.

In the first embodiment, a protection layer 23 is formed in areas laterally surrounding Ca/Al multilayered electrodes 21 (i.e. upward from the light emitting layer 18) and upward from the Ca/Al multilayered electrodes 21 (on the side opposite from the light emitting layer 18). A sealing layer 26 is formed upward from the protection layer 23 (on the side opposite from the multilayered electrodes 21), and antireflection layers 28 corresponding to the Ca/Al multilayered electrodes 21 are formed on portions of the sealing layer 26. On the other hand, in this embodiment, a sealing layer 26 is formed in areas laterally surrounding Ca/Al multilayered electrodes 21 (i.e. upward from the light emitting layer 18) and upward from the Ca/Al multilayered electrodes 21 (on the side opposite from the light emitting layer 18), antireflection layers 28 are formed on portions of the sealing layer 26 corresponding to the Ca/Al multilayered electrodes 21, and no protection layer is provided between the Ca/Al multilayered electrodes 21 and the antireflection layers 28.

In the case of manufacturing a frontlight 3b having an organic EL element of the above-described structure, the procedure of producing the cathode side glass substrate 16 is exactly common with the first embodiment for steps antecedent to the step shown in FIG. 5F. The procedure of producing the antireflection-layer side cover glass 27 is also perfectly common with the first embodiment up to the end of the step shown in FIG. 6J. After having gone through all the common steps, on the multilayered electrodes 21 of the cathode side glass substrate 16 is placed a photo-hardening fluid acrylic resin or heat-hardening fluid epoxy resin as a material 26a used to form the sealing layer 26, followed by setting the cathode side glass substrate 16 and antireflection-layer side cover glass 27 as shown in FIG. 10.

Subsequently, the cathode side glass substrate 16 with the material 26a placed thereon and the antireflection-layer side cover glass 27 are placed in a vacuatable chamber (not shown), followed by evacuating the chamber, and putting together, aligning, and bonding the cathode side glass substrate 16 and antireflection-layer side cover glass 27. Through the steps, the sealing layer 26 is formed between the cathode side glass substrate 16 and antireflection-layer side cover glass 27 and thus a frontlight 3b having an organic EL element of the embodiment is completed. Incidentally, in the case where a photo-hardening fluid acrylic resin is used as a material 26a, the material 26a is hardened by irradiating the material with light through the cover glass 27 after aligning the cathode side glass substrate 16 and antireflection-layer side cover glass 27.

The frontlight 3b of the embodiment has a structure such that the sealing layer 26 is formed between the cathode side glass substrate 16 and antireflection-layer side cover glass 27. Also in manufacturing the frontlight 3b, a substrate (cover glass 27) independent of the glass substrate 16 is used to form the antireflection layers 28 on the cover glass 27 through patterning. As a result, it becomes possible to certainly prevent the degradation of the cathodes 21 and light emitting layer 18 and improve the reliability and light emission characteristics of an organic EL element.

In reference to FIGS. 11, and 12A–12B, a third embodiment of the invention is described below.

Figure 11:
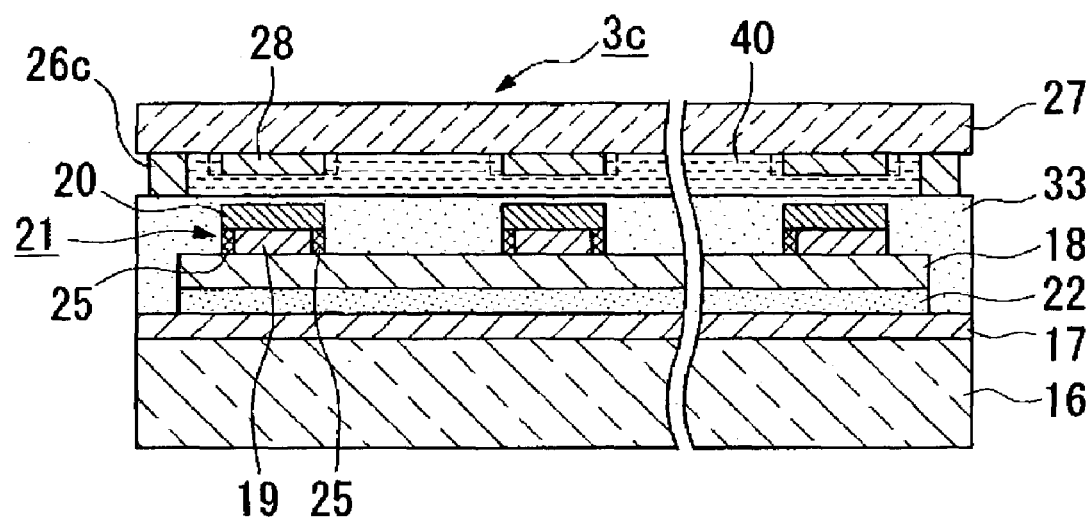
FIG. 11 is a cross section showing a frontlight according to a third embodiment of the invention.

FIG. 11 is a cross section showing a frontlight of a liquid crystal display device of the embodiment. FIGS. 12A–12B are process drawings for explanation of a method for manufacturing a frontlight of the embodiment.

A liquid crystal cell of a liquid crystal display device of the embodiment has exactly the same basic configuration as that of the first embodiment. A frontlight 3c of a liquid crystal display device of the embodiment is the same that of the first embodiment, except for a difference in the layer interposed between the cathode side glass substrate 16 and antireflection-layer side cover glass 27. Therefore, constituent elements commonly used in FIGS. 11, 12A–12B and FIGS. 3–7 are identified by the same reference characters or numerals, and their detailed descriptions are omitted.

In the first embodiment, a sealing layer 26 is formed upward from a protection layer 26 (on the side opposite from multilayered electrodes 21) substantially all over; and a cover glass 27 on the side of the antireflection layer 28 is formed on the sealing layer 26. On the other hand, in this embodiment, a gap material filled sealing layer 26c is formed upward from the protection layer 23 substantially in an annular form, an antireflection-layer side cover glass 27 is formed upward from the gap material filled sealing layer 26c, and a space surrounded by the gap material filled sealing layer 26c, antireflection-layer side cover glass 27 and protection layer 23 is charged with a matching oil 40. The gap material filled sealing layer 26c is made of a heat-hardening resin, such as epoxy resin or the like, with a gap material. As for the matching oil 40, an oil having a refractive index approximately equal to that of the cover glass 27 is used. For example, in the case of using a glass substrate having a refractive index of about 1.5–1.6 as the cover glass 27, a silicon-based matching oil having a refractive index of about 1.503 or the like is used as the matching oil.

In the case of manufacturing a frontlight 3c having an organic EL element of the above-described configuration, the procedure of producing the cathode side glass substrate 16 is perfectly common with the first embodiment up to the end of the step shown in FIG. 5F. The procedure of producing the antireflection-layer side cover glass 27 is similar with the first embodiment up to the end of the step shown in FIG. 6J. After having gone through all the common steps, a gap material filled sealing layer 26c is formed on the cover glass 27 on the side of the antireflection layer by a coating method so as to lie inwardly from a periphery of the cover glass 27 as shown in FIG. 12A. It is desirable that the gap material filled sealing layer 26c formed here is provided with two openings 26d because the capillary phenomenon allows the matching oil 40 to be charged more easily in a later step. It is also desired to provide the opening 26d only at one place in that vacuum filling can avoid bubbles certainly. Whether to provide the opening 26d at one place or two places can be selected appropriately.

Figure 12:
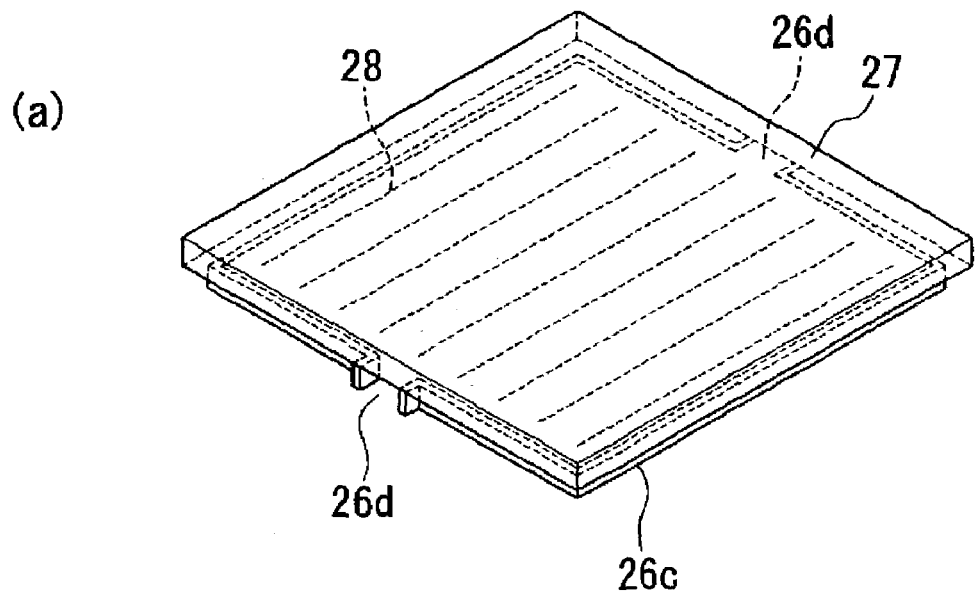
FIGS. 12A and 12B are process drawings for explanation of a method for manufacturing the frontlight.
Figure 12:
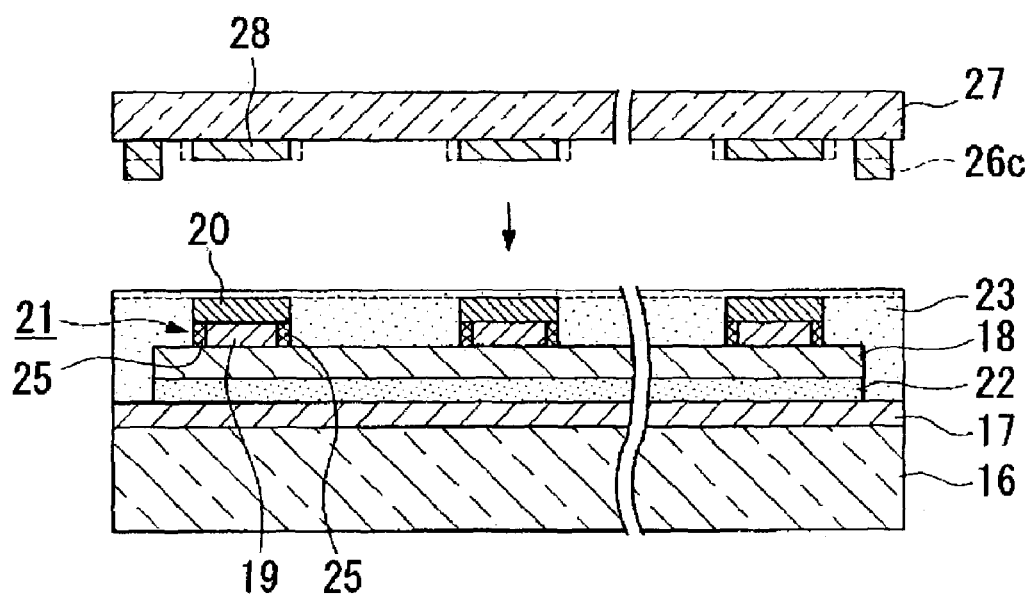

Subsequently, the antireflection-layer side cover glass 27 with the gap material filled sealing layer 26c formed thereon is placed on and aligned with the cathode side glass substrate 16, as shown in FIG. 12B. Thereafter, both the substrates are pressed against each other and heated within the bounds of not affecting the gap light emitting layer 18 to cure the gap material filled sealing layer 26c, thereby bonding the cathode side glass substrate 16 and antireflection-layer side cover glass 27 through the gap material filled sealing layer 26c.

Then, charging a matching oil 40 through one of the openings 26d formed in the gap material filled sealing layer 26c and sealing both the openings 26d, a frontlight 3c having an organic EL element of the embodiment is completed.

A frontlight 3b has a structure such that a gap material filled sealing layer 26c in a substantially annular form is formed between the cathode side glass substrate 16 and antireflection-layer side cover glass 27. Also, in manufacturing the frontlight 3c, a substrate (cover glass 27) independent of the glass substrate 16 is used to form the antireflection layers 28 on the cover glass 27 through patterning. As a result, it becomes possible to certainly prevent the degradation of the cathodes 21 and light emitting layer 18 and improve the reliability and light emission characteristics of an organic EL element.

In the case of manufacturing a frontlight 3c of the above-described structure, forming the gap material filled sealing layer 26c in a substantially annular form facilitates the movement and alignment of the cathode side glass substrate 16 and antireflection-layer side cover glass 27 when aligning the cathode side glass substrate 16 and antireflection-layer side cover glass 27 in comparison to the case of forming the sealing layer substantially all over the surface.

While the protection layer 23 is formed in areas laterally surrounding and upward from the patterned Ca/Al multilayered electrodes 21 in the step shown in FIG. 12B, the protection layer 23 may be formed only in areas laterally surrounding the patterned Ca/Al multilayered electrodes 21 and the top surfaces of the electrodes 21 may be left exposed as illustrated by the dotted line. Further, while the gap material filled sealing layer 26c is formed to be larger than the antireflection layers 28 in thickness in the step shown in FIGS. 12A and 12B, the gap material filled sealing layer 26c may be formed to have the same thickness as that of the antireflection layers 28 as illustrated by the dotted line in FIG. 12B.

Figure 13:
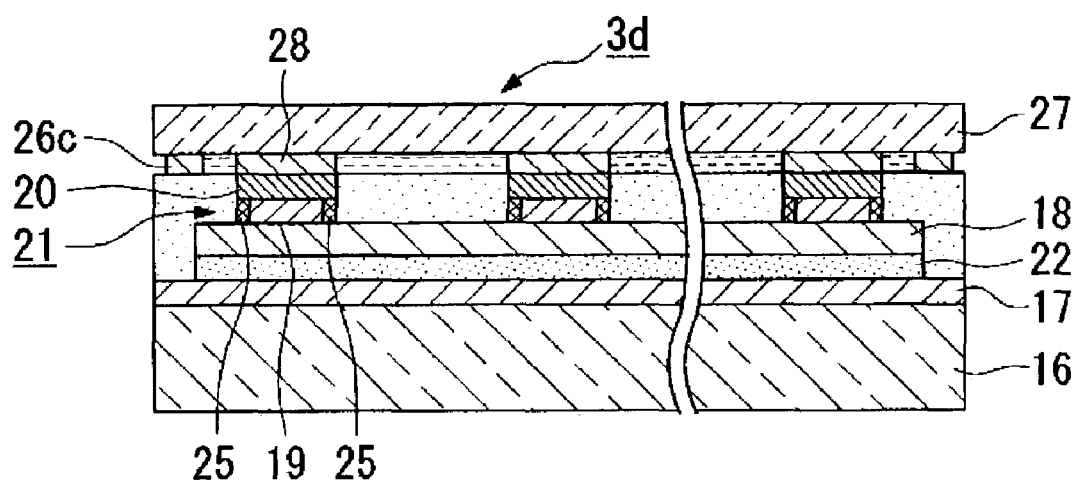
FIG. 13 is a cross section showing a frontlight of another embodiment of the invention.

Thus, aligning and bonding the cathode side glass substrate 16, in which top surfaces of the Ca/Al multilayered electrodes 21 are exposed, and the antireflection-layer side cover glass 27 having a gap material filled sealing layer 26c of the same thickness as that of antireflection layers 28 formed thereon, a frontlight 3d of another embodiment of the invention, as shown in FIG. 13, can be completed. The frontlight 3d can offer the same advantages as the frontlight 3c.

Figure 14:
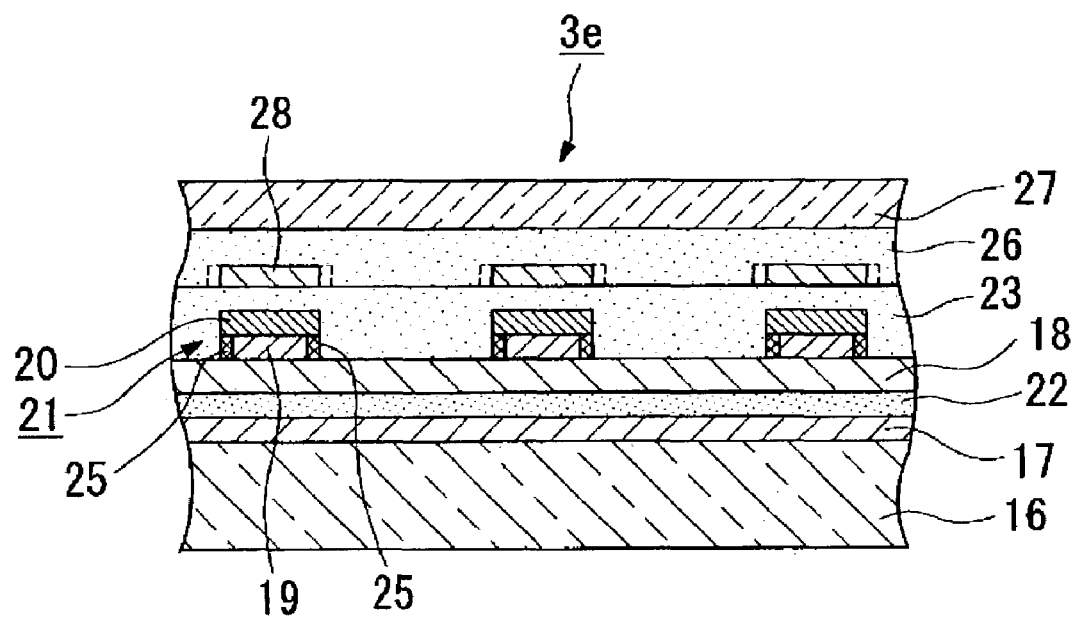
FIG. 14 is a cross section showing a frontlight of a fourth embodiment of the invention.

In reference to FIGS. 14, 15A–15C, and 16D–16F, a fourth embodiment of the invention is described below. FIG. 14 is a cross section showing a frontlight of a liquid crystal display device of the embodiment. FIGS. 15A–15C and 16D–16F are cross sections for explanation of process steps of a method for manufacturing a frontlight of the embodiment.

A liquid crystal cell of a liquid crystal display device of the embodiment has exactly the same basic configuration as that of the first embodiment. A frontlight 3e of a liquid crystal display device of the embodiment is the same that of the first embodiment, except for a difference in the location where the antireflection layers 28 are formed. Therefore, constituent elements commonly used in FIGS. 14, 15A–15C, 16D–16F and FIGS. 3–7 are identified by the same reference characters or numerals, and their detailed descriptions are omitted.

In the first embodiment, the protection layer 23 is formed in areas laterally surrounding the Ca/Al multilayered electrodes 21 (i.e. upward from the light emitting layer 18) and upward from the Ca/Al multilayered electrodes 21 (on the side opposite from the light emitting layer 18) so as to cover the Ca/Al multilayered electrode 21; the sealing layer 26 is formed upward from the protection layer 23 (on the side opposite from the multilayered electrodes 21); the antireflection layers 28 corresponding to the Ca/Al multilayered electrodes 21 are formed on portions of the sealing layer 26; and the cover glass 27 is provided upward from the sealing layer 26 and antireflection layers 28. On the other hand, in this embodiment, a protection layer 23 is formed in areas laterally surrounding the Ca/Al multilayered electrodes 21 (i.e. upward from the light emitting layer 18) and upward from the Ca/Al multilayered electrodes 21 (on the side opposite from the light emitting layer 18), antireflection layers 28 corresponding to the Ca/A1 multilayered electrodes 21 are formed on portions of the protection layer 23, a sealing layer 26 is formed in areas laterally surrounding the antireflection layers 28 (upward from the protection layer 23) and upward from the antireflection layers 28 (sealing layer 26 is formed adjacent to the antireflection layers 28), and a cover glass 27 is provided upward from the sealing layer 26.

Accordingly, in a frontlight 3e of a liquid crystal display device of the embodiment, the protection layer 23 is provided between the Ca/Al multilayered electrodes 21 and antireflection layers 28, whereas the sealing layer 26 is not provided therebetween. In addition, the antireflection layers 28 are provided not on the lower surface of the cover glass 27 but between the protection layer 23 and sealing layer 26.

In the case of manufacturing a frontlight 3e having an organic EL element of the above-described configuration, the procedure is perfectly common with the first embodiment up to the end of the step shown in FIG. 5F. After having gone through all the common steps, an anti-reflecting material layer 28a composed of a Cr/Cr-oxide stacking layer or black pigment containing resin layer is formed on the protection layer 23 as shown in FIG. 15A, followed by forming a photoresist film 34 on the anti-reflecting material layer 28a.

Figure 15:
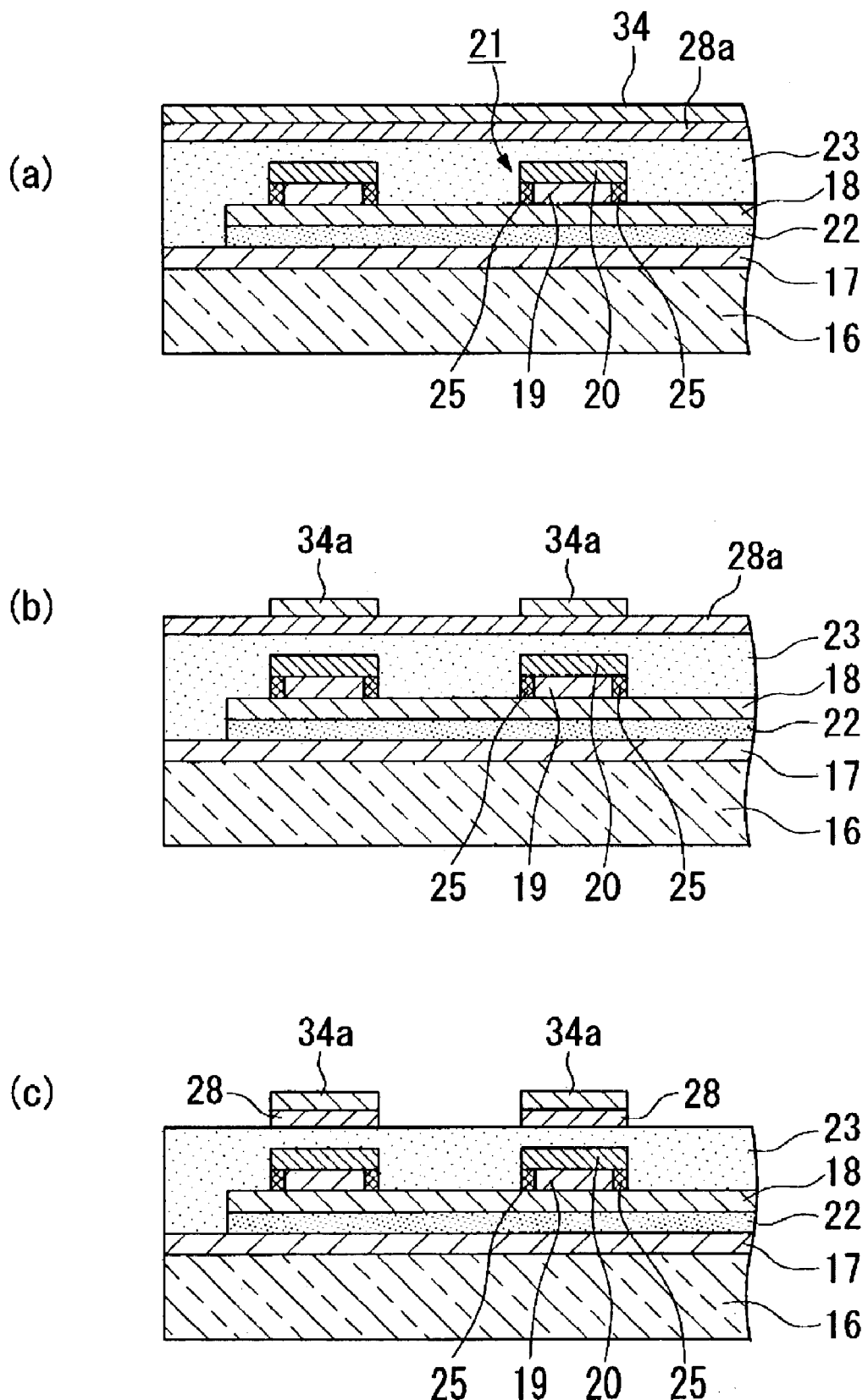
FIGS. 15A–15C are process drawings for explanation of a method for manufacturing the frontlight.

In the subsequent step, the photoresist film 34 is exposed and developed to form a photoresist pattern 34a by a photolithography technique as shown in FIG. 15B.

Then, the anti-reflecting material layer 28a is etched using the photoresist pattern 34a as a mask through wet etching until the surface of the protection layer 23 is exposed as shown in FIG. 15C. Incidentally, when patterning the anti-reflecting material layer 28a, the antireflection layers 28 may be larger than the multilayered electrodes 21 in width.

Figure 16:
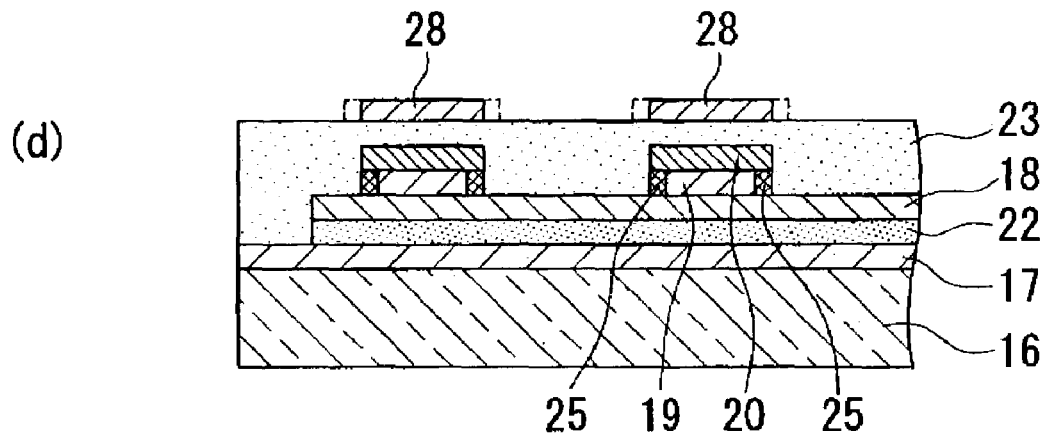
FIGS. 16D–16F are process drawings following FIGS. 15A–15C.
Figure 16:
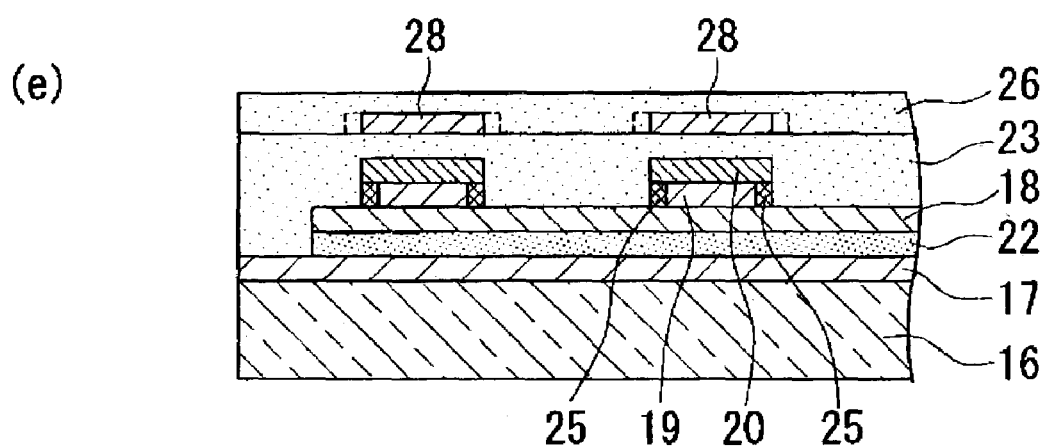
Figure 16:
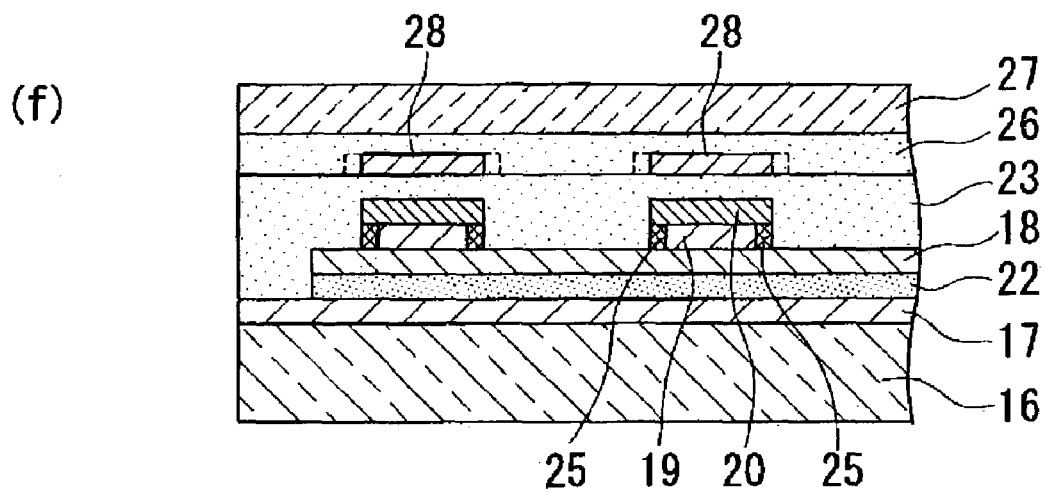
Figure 17:
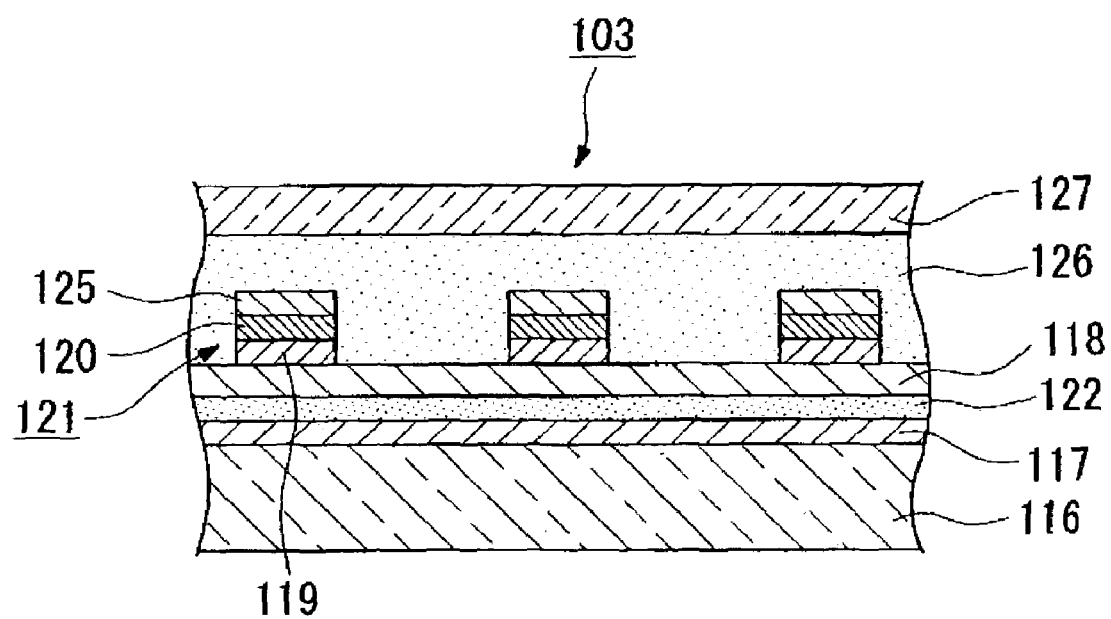
FIG. 17 is a cross section showing a schematic configuration of a conventional organic EL element.

After that, removing the photoresist pattern 34a with a resist stripper, antireflection layers 28 corresponding to the Ca/Al multilayered electrodes 21 can be attained as shown in FIG. 16D.

Next, as shown in FIG. 16E, a sealing layer 26 is formed all over so as to cover exposed surfaces of the antireflection layers 28 and the protection layer 23, whereby the sealing layer 26 is formed in areas laterally surrounding and upward from the antireflection layers 28.

Then, as shown in FIG. 16F, a cover glass 27 is placed on the sealing layer 26, whereby a frontlight 3e having an organic EL element of the embodiment is completed.

A frontlight 3e of the embodiment has a structure such that a protection layer 23 is formed between the Ca/Al multilayered electrodes 21 and antireflection layers 28. In other words, the frontlight 3e takes on a structure such that a protection layer 23 covers Ca/Al multilayered electrodes 21 by forming a transparent electrode 17 on a glass substrate 16, and then forming a hole transport layer 22, a light emitting layer 18, and Ca/Al multilayered electrodes 21 in order, and further a protection layer 23 on the Ca/Al multilayered electrodes 21, and antireflection layers 28 on portions of the protection layer 23, as described above, in manufacturing the frontlight 3e. As a result, the multilayered electrodes 21 are not exposed to chemicals including a liquid developer, etc. in the step of photolithography when patterning the antireflection layers 28, and therefore the degradation of the multilayered electrodes 21 can be prevented.

Further, in the case where the antireflection layers 28 are formed from black pigment containing resin layers, the black pigment containing resin layer is formed by applying a black pigment containing resin through spin coating. In this case, a structure such that the protection layer 23 covers not only the Ca/Al multilayered electrode 21 but also the light emitting layer 18 through the Ca/Al multilayered electrodes 21 is attained because the protection layer 23 is formed on the Ca/Al multilayered electrodes 21. Therefore, the Ca/Al multilayered electrodes 21 and light emitting layer 18 are not affected when forming the black pigment containing resin layer and thus the degradation of the Ca/Al multilayered electrodes 21 and light emitting layer 18 can be prevented.

The above structure, in which the light emitting layer 18 is also covered by the protection layer 23 through the multilayered electrodes 21, allows the dissipation of heat resulting from light absorption when the anti-reflecting material layer 28a absorbs ultraviolet light in the above photolithography step. Therefore, the light emitting layer 18 is not affected and it becomes possible to prevent the degradation of the light emitting layer 18.

In the case of manufacturing a frontlight 3e according to a manufacturing method of the embodiment, the multilayered electrodes 21 and antireflection layers 28 can be placed opposite each other, even if there is some deviation in the location where antireflection layers 28 are formed or some patterning inaccuracy in forming antireflection layers 28 just above the Ca/Al multilayered electrodes 21 through the protection layer 23.

It should be understood that the technical scope of the invention is not limited to the above embodiments, and various changes and modifications may be made within a scope without departing from the spirit and scope of the invention. For instance, while Ca is noted as an exemplary alkaline-earth metal in the above embodiments, other alkaline-earth metals such as Mg, Sr, and Ba also may be applied in the invention because they can produce the same effect as that of Ca. As for a configuration of the organic EL element, it may be arranged to have a hole injection layer, an electron injection layer, and the like in addition to a light emitting layer and a hole transport layer.

Otherwise, a liquid crystal display device is noted as an example of a display device in the embodiments. However, an organic EL element of the invention may be used as an illuminating unit for a nonluminous and reflection type display device such as an electrophoretic display device. Additionally, an organic EL element of the invention may be used not only as an illuminating unit but also as a display device in itself. In that case, however, an anode and cathode are patterned and the organic EL element is applied as a passive matrix type display device.

As described above in detail, an organic EL element of the invention is arranged to have at least one of a protection layer and a sealing layer formed at least between the cathodes and antireflection layers. Therefore, it becomes possible to certainly prevent the degradation of the cathodes and light emitting layer, and improve the reliability and light emission characteristics of an organic EL element. For example, by using a substrate (second substrate) independent of a first substrate, forming antireflection layers on one surface of the second substrate through patterning, and putting together, aligning, and bonding the second substrate with the antireflection layers formed thereon and the first substrate with an anode, a light emitting layer, and cathodes, and a protection layer, if necessary, formed in areas laterally surrounding and upward from the cathodes, when manufacturing the organic EL element.

Further, in manufacturing an organic EL element of the above-described structure, the organic EL element takes on a structure such that a protection layer covers cathodes by forming an anode on a first substrate, then a light emitting layer, the cathodes, the protection layer on the cathodes, and antireflection layers on the protection layer. As a result, it becomes possible to certainly prevent the degradation of the cathodes and light emitting layer and improve the reliability and light emission characteristics of an organic EL element.

What is claimed is:

1. An organic electro-luminescence element, comprising:
    a first substrate;
    an anode containing a transparent conductive material;
    a light emitting layer containing an organic electro-luminescence material;
    cathodes, each cathode including a metal layer and being formed in a portion of a forming region for said light emitting layer;
    antireflection layers; and
    at least one of a protection layer and a sealing layer,
    said anode, light emitting layer, and cathodes being stacked on said first substrate in an order where said antireflection layers are stacked corresponding to said cathodes, and said at least one of the protection layer and sealing layer is formed at least between said cathodes and antireflection layers.

2. The organic electro-luminescence element of claim 1, said at least one of the protection layer and sealing layer, and said antireflection layers being covered by a second substrate.

3. The organic electro-luminescence element claim 1, said sealing layer being formed on said protection layer.

4. The organic electro-luminescence element of claim 3, a gap material being mixed into said sealing layer,
    the gap material filled sealing layer being formed on said protection layer substantially in an annular form, and
    a space located inwardly from said gap material filled sealing layer being charged with a matching oil.

5. The organic electro-luminescence element of claim 1, said protection layer being formed at least between said cathodes and antireflection layers, and the sealing layer being formed at least adjacent to said antireflection layers.

6. The organic electro-luminescence element of claim 1, said antireflection layer being a layer containing at least chromium (Cr) or a black pigment.

7. The organic electro-luminescence element of claim 1, said antireflection layer being formed to be larger than said cathode in width.

8. The organic electro-luminescence element of claim 1, said cathode being composed of a multilayered electrode including an alkaline-earth metal layer and a metal layer.

9. A display device, comprising:
    an illuminating unit including the organic electro-luminescence element of claim 1; and
    a display unit wherein light emitted from said illuminating unit is used for reflection display.

10. The display device of claim 9, said display unit being a reflection-type liquid crystal display device, and
    the cathodes of said organic electro-luminescence element constituting said illuminating unit being placed corresponding to non-opening regions of said reflection-type liquid crystal display device.

11. An electro-luminescent element, comprising:
    a first electrode;
    a second electrode disposed above the first electrode;
    a light-emitting layer that includes electro-luminescence material and that is disposed between the first electrode and the second electrode;
    a plurality of first films that are disposed above the second electrode, each of the plurality of first films including at least one of an antireflection material, chromium, and a black pigment;
    a second film covers the second electrode, the second film being disposed between the plurality of first films and the second electrode;
    a third film that covers the plurality of the first films; and
    a light emitted at the light-emitting layer transmitting through the second electrode and the second film, and
    the plurality of first films being disposed between the second film and the third film.

12. The electro-luminescent element according to claim 11, the second electrode including a metal material.

13. The electro-luminescent element according to claim 11, the second film including a gap material and an oil disposed in an area enclosed by the gap material.

14. A display device comprising the electro-luminescent element according to claim 11.

15. The electro-luminescent element according to claim 11, the first electrode and the second electrode functioning as an anode and a cathode, respectively.

16. The electro-luminescent element according to claim 11, the second film functioning as at least one of a sealing film and a protection film.

17. The electro-luminescent element according to claim 11, the third film being a substrate.

18. An electro-luminescent element, comprising:
    a first electrode;
    a second electrode disposed above the first electrode;
    a light-emitting layer that includes electro-luminescence material and that is disposed between the first electrode and the second electrode;

a first layer disposed above the second electrode, the first layer includes a plurality of films including at least one of an antireflection material, chromium, and a black pigment; and a second layer that is disposed between the second electrode and the first layer and that functions as at least one of a sealing layer and a protection layer; and an opening region being formed between one of the plurality of films and another of the plurality of films.

19. The electro-luminescent element according to claim 18, a light emitted at the light-emitting layer transmitting through the opening region.

* * * * *